US011248139B2

(12) United States Patent
Yang et al.

(10) Patent No.: US 11,248,139 B2
(45) Date of Patent: Feb. 15, 2022

(54) INK COMPOSITIONS AND QUANTUM DOT POLYMER COMPOSITE PATTERN PREPARED FROM THE SAME

(71) Applicant: Samsung Display Co., Ltd., Yongin-si (KR)

(72) Inventors: Hyeyeon Yang, Suwon-si (KR); Shang Hyeun Park, Yongin-si (KR); Shin Ae Jun, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/065,939

(22) Filed: Oct. 8, 2020

(65) Prior Publication Data

US 2021/0102084 A1 Apr. 8, 2021

(30) Foreign Application Priority Data

Oct. 8, 2019 (KR) ........................ 10-2019-0124903

(51) Int. Cl.
| | | |
|---|---|---|
| C09D 11/52 | (2014.01) | |
| B01J 31/24 | (2006.01) | |
| C09D 11/107 | (2014.01) | |
| C09K 11/02 | (2006.01) | |
| C09K 11/08 | (2006.01) | |
| C09K 11/56 | (2006.01) | |
| H01L 51/50 | (2006.01) | |
| C09D 11/38 | (2014.01) | |
| B01J 31/34 | (2006.01) | |
| B01J 31/12 | (2006.01) | |
| H01L 33/50 | (2010.01) | |
| B01J 31/28 | (2006.01) | |
| C09D 5/22 | (2006.01) | |
| B01J 31/16 | (2006.01) | |
| B01J 31/04 | (2006.01) | |
| B01J 31/30 | (2006.01) | |
| B82Y 20/00 | (2011.01) | |
| B82Y 30/00 | (2011.01) | |
| B82Y 40/00 | (2011.01) | |

(52) U.S. Cl.
CPC ............... *C09D 11/52* (2013.01); *B01J 31/04* (2013.01); *B01J 31/122* (2013.01); *B01J 31/16* (2013.01); *B01J 31/2452* (2013.01); *B01J 31/28* (2013.01); *B01J 31/30* (2013.01); *B01J 31/34* (2013.01); *C09D 5/22* (2013.01); *C09D 11/107* (2013.01); *C09D 11/38* (2013.01); *C09K 11/02* (2013.01); *C09K 11/025* (2013.01); *C09K 11/0883* (2013.01); *C09K 11/565* (2013.01); *H01L 33/502* (2013.01); *H01L 33/508* (2013.01); *H01L 51/502* (2013.01); *B01J 2531/824* (2013.01); *B82Y 20/00* (2013.01); *B82Y 30/00* (2013.01); *B82Y 40/00* (2013.01)

(58) Field of Classification Search
CPC ...... C09D 5/22; C09K 11/02; C09K 11/0883; C09K 11/565; H01L 33/508; B01J 31/16; B01J 31/04; B01J 31/122; B01J 31/30; B01J 31/28; B01J 31/34; B01J 31/2452
See application file for complete search history.

(56) References Cited

U.S. PATENT DOCUMENTS

| | | |
|---|---|---|
| 7,589,240 B2 | 9/2009 | Emrick et al. |
| 10,513,656 B2 | 12/2019 | Nick et al. |
| 2010/0264812 A1 | 10/2010 | Nobuhiko et al. |
| 2011/0084250 A1 | 4/2011 | Jang et al. |
| 2018/0009676 A1 | 1/2018 | Pickett et al. |
| 2020/0071607 A1 | 3/2020 | Nick et al. |

FOREIGN PATENT DOCUMENTS

| | | |
|---|---|---|
| CN | 106519799 A | 3/2017 |
| CN | 105331196 B | 4/2018 |
| CN | 108531161 A | 9/2018 |
| EP | 1321497 B1 | 4/2006 |
| JP | 2018065911 A | 4/2018 |
| KR | 20170056610 A | 5/2017 |
| KR | 20180099991 A | 9/2018 |
| WO | 2018002607 A2 | 1/2018 |

OTHER PUBLICATIONS

Andrea Castelli et al., "High-Efficiency All-Solution-Processed Light-Emitting Diodes Based on Anisotropic Colloidal Heterostructures with Polar Polymer Injecting Layers," Nano Letters, Jul. 22, 2015, pp. 5455-5464, vol. 15.
Extended European Search Report dated Dec. 10, 2020, of the corresponding European Patent Application No. 20200602.9.
Xiaofei Mei et al., "Carbazole-based diphenyl maleimides: Multifunctional smart fluorescent materials for data process and sensing for pressure, explosive and pH," Dyes and Pigments, Jun. 13, 2016, pp. 345-353, vol. 133.

*Primary Examiner* — C Melissa Koslow
(74) *Attorney, Agent, or Firm* — Cantor Colburn LLP

(57) ABSTRACT

An ink composition, including a quantum dot; a metal catalyst; an aromatic halide compound; an ene compound including at least one C—H moiety and a carbon-carbon unsaturated bond; and optionally, a metal oxide particle, wherein the metal catalyst is a metal salt, a metal coordination complex, or a combination thereof, wherein the metal catalyst comprises a metal that is palladium, nickel, ruthenium, rhodium, iridium, iron, cobalt, chromium, copper, platinum, silver, gold, or a combination thereof.

26 Claims, 7 Drawing Sheets

INK COMPOSITIONS AND QUANTUM DOT POLYMER COMPOSITE PATTERN PREPARED FROM THE SAME

CROSS-REFERENCE TO RELATED APPLICATION

This application claims priority to and the benefit of Korean Patent Application No. 10-2019-0124903 filed in the Korean Intellectual Property Office on Oct. 8, 2019, and all the benefits accruing therefrom under 35 U.S.C. § 119, the content of which in its entirety is incorporated herein by reference.

BACKGROUND

1. Field

An ink composition and a quantum dot-polymer composite pattern prepared therefrom are disclosed.

2. Description of the Related Art

Quantum dots may be applicable for various display devices such as a liquid crystal display in the form of a quantum dot-polymer composite. In order to be applied to various display devices, developing a technique to provide a quantum dot-polymer composite pattern with higher efficiency is desirable.

SUMMARY

An embodiment provides an ink composition capable of providing a quantum dot-polymer composite pattern.

Another embodiment provides a method of producing such an ink composition.

Another embodiment provides a method of producing a quantum dot-polymer composite pattern using the ink composition.

Another embodiment provides a stack structure including the quantum dot-polymer composite.

Another embodiment provides an electronic (e.g., display) device including the quantum dot-polymer composite.

In an embodiment, an ink composition includes a (e.g., plurality of) quantum dot(s); a metal catalyst; an aromatic halide compound; and an ene compound including at least one C—H moiety and a carbon-carbon unsaturated bond; wherein the metal catalyst comprises a metal salt, a metal coordination complex, or a combination thereof; wherein the metal catalyst comprises a metal that is palladium, nickel, ruthenium, rhodium, iridium, iron, cobalt, chromium, copper, platinum, silver, gold, or a combination thereof.

An amount of the metal may be less than or equal to about 0.2 moles based on one mole of the ene-compound.

The metal catalyst may include a transition metal. The metal catalyst may include a group 10 transition metal.

The metal catalyst may include a metal that is palladium, nickel, ruthenium, rhodium, iridium, iron, cobalt, chromium, copper, platinum, silver, gold, or a combination thereof.

The metal catalyst may include a carboxylate group (e.g., an acetate group), an aryl phosphine group (e.g., a phenyl phosphine group), or a combination thereof.

The ink composition may further include a metal oxide particle.

The ink composition may have a viscosity of less than or equal to about 20 centipoise (cP) for example, measured at a predetermined temperature (e.g., at room temperature such as about 20° C. to 25° C. or about 23° C.).

The ink composition may have a viscosity of less than or equal to about 10 centipoise (cP).

The viscosity of the ink composition may be greater than or equal to about 5 centipoise (cP).

The viscosity of the ink composition may be from about 7 cP to about 12 cP.

The ink composition may have a vapor pressure at 20° C. of less than or equal to about 3 mmHg.

The ink composition may have a vapor pressure at 20° C. of less than or equal to about 1.5 mmHg, less than or equal to about 1 mmHg, less than or equal to about 0.15 mmHg.

The ink composition may have a boiling point of greater than or equal to about 150° C. The ink composition may have a boiling point of greater than or equal to about 190° C. The ink composition may have a boiling point of less than or equal to about 490° C., less than or equal to about 460° C., less than or equal to about 350° C., or less than or equal to about 310° C.

The ink composition may exhibit an average particle size of less than or equal to about 5 micrometer ($\mu m$) or less than or equal to about 2 $\mu m$, as determined by a dynamic light scattering analysis (DLSA).

The quantum dots may be a Group II-VI compound, a Group III-V compound, a Group IV-VI compound, a Group IV element or compound, a Group compound, a Group compound, a Group I-II-IV-VI compound, or a combination thereof.

The quantum dot may include a core including a first semiconductor nanocrystal, wherein the first semiconductor nanocrystal includes indium, zinc, or a combination thereof; and a shell disposed on the core and including a second semiconductor nanocrystal having a different composition from the first semiconductor nanocrystal.

The quantum dot may have an organic ligand (for example, disposed on a surface thereof) and the organic ligand may be $RCOOH$, $RNH_2$, $R_2NH$, $R_3N$, $RSH$, $R_3PO$, $R_3P$, $ROH$, $RCOOR$, $RPO(OH)_2$, $RHPOOH$, $R_2POOH$, or a combination thereof, wherein, each R is independently a substituted or unsubstituted C1 to C40 aliphatic hydrocarbon group, or a substituted or unsubstituted C6 to C20 aromatic hydrocarbon group.

The metal catalyst may include a palladium salt, a palladium (coordination) complex, or a combination thereof.

The palladium salt or the palladium complex may include a zero-valent palladium compound, a palladium(II)compound, or a combination thereof. In an embodiment, the palladium salt may be a palladium (II) compound and the palladium complex includes a zero-valent palladium(0) compound.

The zero-valent palladium(0) compound may include a tetrakis(triarylphosphine)palladium(0), and the palladium (II) compound may include a palladium halide, a palladium organic ester compound, a palladium inorganic ester compound, or a combination thereof.

The metal catalyst may further include a base compound, a supporting ligand, or a combination thereof.

The base compound may include a (C1 to C10) tertiary amine, an alkali metal carbonate, an alkali earth metal carbonate, an alkali metal carboxylate, an alkali earth metal carboxylate, or a combination thereof.

The supporting ligand may be an organic phosphine compound, an organic amine compound, a phosphinooxazoline, a phosphinooxazoline ester, acetylacetonate, or a combination thereof.

The metal catalyst may be Pd(OAc)₂, Pd(PPh₃)₄, PdCl₂, PdCl₂[P(o-Tol)₃]₂, Ni(acac)₂, NiCl₂(dppe), NiCl₂(dppp), NiCl₂(PCy₃)₂, NiCl₂(dbpf), NiCl₂(PCy₂Ph)₂, NiCl₂(IPr) (PPh₃), Ni(cod)₂ RuCl₂(PPh₃)₃, CpRuCl(PPh₃)₂, RuH₂(CO) (PPh₃)₃, Ru(acac)₃, [(C₆H₆)RuCl₂]₂, [(hmb)RuCl₂]₂, [(p-cymene)RuCl₂]₂, RuH(PPh₃)4, RhCl(PPh₃)₃, RhCl(CO) (PPh₃)₂, Rh₂(OAc)₄, Rh(nbd)₂(BF₄), [RhCl(nbd)]₂, [RhCl (cod)]₂, [RhCl(coe)₂]₂, [RhCl(ethylene)₂]₂, [Cp*RhCl₂]₂, [Rh₂(esp)]₂, [Ir(cod)(PCy₃)(py)]PF₆, [Cp*IrCl₂]₂, [IrCl (cod)]₂, [Ir(OMe)(cod)]₂, IrCl(CO)(PPh₃)₂, IrH(CO) (PPh₃)₂, Ir(acac)(cod), [IrCl(coe)₂]₂, Fe(OAc)₂, Fe(acac)₃, Fe(hfacac)₃, [CpFe(CO)₂]₂, Fe(dppd)₃, FeCl₃, CoCl₂, CrCl₂, CuI, CuO, Cu(OAc)₂, Cu(acac)₂, Cu(tfa)₂, Cu(hfacac)₂, Cu(acac)(cod), (IMes)CuCl, (IPr)CuCl, (IPr)Cu (dppd), Cu(OH)(tmeda)Cl₂, Pt(PPh₃)₄, Pt(P(t-Bu)₃)₂, PtCl₂ (cod), Pt(acac)₂, (IPr)AgCl, (IPr)AuCl, (PPh₃)AuCl, or a combination thereof, wherein OAc is acetate, OMe is methoxy, Cy is cyclopentyl, dppd is N,N'-diphenyl-1,4-phenylenediamine, dppe is bis(diphenylphosphine)ethane, dbpf is 1,1'-Bis(diphenylphosphino)ferrocene, dppp is 1,3-Bis(diphenylphosphino)-propane], esp is α,α,α',α'-tetramethyl-1,3-benzenedipropionic acid, hmb is η⁶-C₆(CH₃)₆, tmeda is bis(N,N,N',N'-tetramethylethylenediamine), acac is acetylacetonate, hfacac is hexafluoroacetylacetonate, Cp is η⁵-cyclopentadienyl, Cp* is η⁵-C₅(CH₃)₅, coe is cis-cyclooctene, cod is 1,5-cyclooctadiene, nbd is bis[η-(2,5-norbomadiene), tfa is trifluoroacetate, Ph is phenyl, o-Tol is ortho-toluoyl, IMes is 1,3-Bis(2,4,6-trimethylphenyl)imidazol-2-ylidene, IPr is 1,3-bis(2,6-diisopropylphenyl)imidazole-2-ylidene, t-Bu is tertiary butyl, and py is pyridyl.

The aromatic halide compound may include a first aromatic halide having a first center aromatic moiety and at least two halogen groups linked to the first center aromatic moiety and optionally a second aromatic halide having a second center aromatic moiety, a single halogen group linked to the second center aromatic moiety, and a hydrophobic moiety.

The first aromatic halide may include a compound represented by Chemical Formula 1 and/or the second aromatic halide may include a compound represented by Chemical Formula 2:

Chemical Formula 1 in the above chemical formula, each R independently is a substituted or unsubstituted C1 to C30 alkyl group; a substituted or unsubstituted C2 to C30 alkyl group in which at least one methylene is replaced with a carbonyl, an ether, an ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, Ar is a substituted or unsubstituted C6 to C40 arene (e.g., a substituted or unsubstituted C6 to C40 arylene optionally with at least one aryl substituent), a substituted or unsubstituted C3 to C40 heteroarene (e.g., a substituted or unsubstituted C3 to C40 heteroarylene), a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen or a nitrogen containing moiety with each other, X is F, Cl, Br, I, or a combination thereof, n is an integer of 2 or greater;

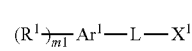

Chemical Formula 2 in the above chemical formula, each R¹ independently is a substituted or unsubstituted C1 to C30 alkyl group; a substituted or unsubstituted C2 to C30 alkyl group in which at least one methylene is replaced with carbonyl, ether, ester, or a combination thereof; C1 to C30 alkoxy group; a trialkylsilyl group; a substituted or unsubstituted C6 to C40 aryl group; or a substituted or unsubstituted C3 to C40 heteroaryl group, L is a direct bond, or a carbon-carbon triple bond, Ar¹ is a substituted or unsubstituted C6 to C40 arene. a substituted or unsubstituted C3 to C40 hetero arene, a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen containing moiety with each other, X¹ is F, Cl, Br, or I, m1 is 0 or an integer of 1 or greater.

The aromatic halide compound may include a first aromatic halide including a dibromoaryl compound, a dichloroaryl compound, a diiodoaryl compound, or a combination thereof, and a second aromatic halide including a monobromoaryl compound, a monochloroaryl compound, a monoiodoaryl compound, or a combination thereof.

The ene compound may include a first ene compound including at least two carbon-carbon unsaturated bonds and optionally a second ene compound including a single carbon-carbon unsaturated bond.

The first ene compound, the second ene compound, or a combination thereof may further include a hydrophobic moiety.

The first ene compound may include a compound represented by Chemical Formula 3 and/or the second ene compound may include a compound represented by Chemical Formula 4-1 or Chemical Formula 4-2:

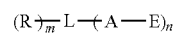

Chemical Formula 3 in the above Chemical Formula 3, each R independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, L is a carbon atom, a substituted or unsubstituted C1 to C50 alkylene group, sulfonyl (—SO₂—), carbonyl (CO), ether (—O—), sulfide (—S—), sulfoxide (—SO—), ester (—C(=O)O—), amide (—C(=O)NR'—) wherein R' is hydrogen or a C1 to C10 alkyl, a bisphenyl A moiety, a substituted or unsubstituted C6 to C40 arene (e.g., a C6 to C40 arylene optionally substituted with at least one aryl group), a substituted or unsubstituted C3 to C40 heteroarene (e.g., a substituted or unsubstituted C3 to C40 heteroarylene), a substituted or unsubstituted C9 to C40 polycyclic aromatic hydrocarbon, a substituted or unsubstituted C9 to C40 polycyclic heteroaromatic hydrocarbon, or a combination thereof, each A independently is a direct bond, a substituted or unsubstituted C1 to C50 alkylene group, sulfonyl (—SO$_2$—), carbonyl (CO), ether (—O—), sulfide (—S—), sulfoxide (—SO—), ester (—C(=O)O—), amide (—C(=O)NR"—) wherein R" is hydrogen or a substituted or unsubstituted C1 to C10 alkyl, or a combination thereof, each E is the same or different each other, and is a (meth)acrylate, —CR=CHR$^a$, or —C≡CH, wherein R or R$^a$ is each independently hydrogen or a substituted or unsubstituted C1 to C10 alkyl group, n is an integer of 2 or greater;

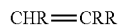  Chemical Formula 4-1

  Chemical Formula 4-2 in the above Chemical Formulae 4-1 and 4-2, each R is the same or different and is hydrogen, C(O)OR$^1$, O—C(O)—R$^1$, a substituted or unsubstituted C1 to C30 alkyl group, or a substituted or unsubstituted C6 to C20 aryl group wherein R$^1$ is a substituted or unsubstituted C1 to C30 alkyl group.

For example, the second ene compound may include

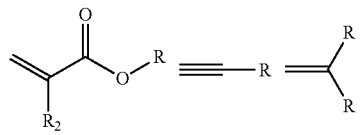

in which R$_2$ and R are each independently hydrogen or a substituted or unsubstituted C1 to C30 alkyl group.

The first ene compound may include an ethylene glycol oligomer having at least two (meth)acrylate groups, a propylene glycol oligomer having at least two (meth)acrylate groups, a bisphenol A glycerolate di(meth)acrylate, a neopentylglycol di(meth)acrylate, or a combination thereof.

The second ene compound may include a (meth)acrylate having a C3 to C30 alkyl group, a vinyl compound having a C3 to C30 alkyl group, or a combination thereof.

The ink composition may include a single compound represented by Chemical Formula 5 as the ene compound and the aromatic halide compound:

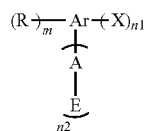  Chemical Formula 5 in the above Chemical Formula 5, each R independently is a substituted or unsubstituted C1 to C30 alkyl group; a substituted or unsubstituted C2 to C30 alkyl group in which at least one methylene is replaced with carbonyl, ether, ester, or a combination thereof; a C1 to C30 substituted or unsubstituted alkoxy group; a trialkylsilyl group; a substituted or unsubstituted C6 to C40 aryl group; or a substituted or unsubstituted C3 to C40 heteroaryl group, m is 0 or an integer of 1 or greater, Ar is a substituted or unsubstituted C6 to C40 arene (e.g., a substituted or unsubstituted C6 to C40 arylene optionally with at least one aryl substituent), a substituted or unsubstituted C3 to C40 heteroarene (e.g., a substituted or unsubstituted C3 to C40 heteroarylene), a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen containing moiety with each other, each X independently is F, Cl, Br, or I, each A independently is a direct bond, a substituted or unsubstituted C1 to C50 alkylene group, sulfonyl (—SO$_2$—), carbonyl (CO), ether (—O—), sulfide (—S—), sulfoxide (—SO—), ester (—C(=O)O—), amide (—C(=O)NR'—) wherein R' is hydrogen or a substituted or unsubstituted C1 to C10 alkyl, or a combination thereof, each E is the same or different each other, and is a (meth)acrylate, —CR=CHR$^a$, or —C≡CH wherein R$^a$ is hydrogen or a substituted or unsubstituted C1 to C10 alkyl group, n1 is an integer of 1 or greater; and n2 is an integer of 1 or greater.

The metal oxide particle may have an average particle size of greater than or equal to about 100 nm and less than or equal to about 500 nm. The metal oxide particle may include titanium oxide, silicon oxide, barium oxide, zinc oxide, hafnium oxide, zirconium oxide, aluminum oxide, gallium oxide, indium oxide, germanium oxide, tin oxide, antimony oxide, scandium oxide, yttrium oxide, lanthanum oxide, ruthenium oxide, cerium oxide, tantalum oxide, niobium oxide, or a combination thereof.

The ink composition may include a quantum dot in an amount of greater than or equal to about 10 wt %, greater than or equal to about 20 wt %, greater than or equal to about 30 wt %, or greater than or equal to about 40 wt %, based on a total weight of the solid content.

The ink composition may include
about 1 wt % to about 60 wt % of the quantum dots;
about 0.01 wt % to about 5 wt % of the metal catalyst, for example including a transition metal such as palladium (e.g., a palladium salt or a palladium coordination complex);
about 1 wt % to about 70 wt % of the aromatic halide compound;
about 1 wt % to about 70 wt % of the ene compound; and
optionally about 1 wt % to about 20 wt % of the metal oxide particle.

The ink composition may be configured to be sprayed through an opening having a width of less than or equal to about 40 μm (micrometers) without clogging the opening.

In another embodiment, a method of producing a quantum dot-polymer composite includes depositing the ink composition disclosed herein on a substrate, for example by a droplet discharging apparatus, to form a (e.g., patterned) film; and reacting the aromatic halide compound and the ene compound in the presence of the metal catalyst. In some embodiments, the method does not include a removal of a volatile organic compound (e.g., the aromatic halide compound).

By the reaction, a polyarylene vinylene polymer may be obtained.

In another embodiment, a quantum dot polymer composite (or a pattern thereof) may include a polymer matrix and a plurality of quantum dots dispersed in the polymer matrix, and the metal catalyst (e.g., the palladium catalyst), wherein the polymer matrix includes a polymer formed by a coupling reaction between an aromatic halide compound and an ene compound having at least one C—H moiety and a carbon-carbon unsaturated bond in the presence of the metal catalyst.

The polymer may include an arylene-vinylene moiety (e.g., an arylene-vinylene moiety repating unit).

An amount of the metal catalyst in the quantum dot polymer composite may be greater than 0 and less than or equal to about 10 wt % based on a total weight of the quantum dot-polymer composite.

When being subjected to a thermogravimetric analysis, a residue amount of the quantum dot polymer composite may be greater than or equal to about 70 wt % based on a total weight of the quantum dot-polymer composite.

The quantum dot polymer composite may further include a metal oxide particle (s) dispersed in the polymer matrix.

In the quantum dot polymer composite, an amount of the quantum dots and the metal oxide particles may be less than or equal to about 90 wt %, less than or equal to about 70 wt %, less than or equal to about 50 wt %, less than or equal to about 45 wt %, less than or equal to about 40 wt %, or based on a total weight of the quantum dot-polymer composite. In the quantum dot polymer composite, an amount of the quantum dots and the metal oxide particles may be greater than or equal to about 10 wt %, greater than or equal to about 20 wt %, greater than or equal to about 25 wt %, or greater than or equal to about 30 wt %.

In an embodiment, a display device includes a light source and a light emitting element, wherein the light emitting element includes the aforementioned quantum dot-polymer composite and the light source provides the light emitting element with incident light.

The incident light may have a peak wavelength of about 440 nanometers to about 460 nanometers.

In an embodiment, the light emitting element may include a stacked structure including a substrate and a light emitting layer disposed on the substrate, wherein the light emitting layer may include a pattern including the quantum dot-polymer composite.

The quantum dot-polymer composite pattern may include at least one repeating section configured to emit light at a predetermined wavelength.

The quantum dot-polymer composite pattern may include a first section configured to emit a first light. The quantum dot-polymer composite pattern may further include a second section configured to emit a second light having a center wavelength that is different from a center wavelength of the first light.

The ink composition may provide a quantum dot-polymer composite pattern through improved processability and without a separate development process (e.g., through a droplet discharging, etc.). The ink composition may be a non-solvent system and may be stably discharged from a nozzle (e.g., from an inkjet system) and may not involve a solvent removal step, and thus may provide a uniform quantum dot-polymer composite film pattern having a large area through a relatively simple process. The quantum dot polymer composite (or a pattern thereof) thus prepared may exhibit improved thermal stability.

DETAILED DESCRIPTION

Figure 1:
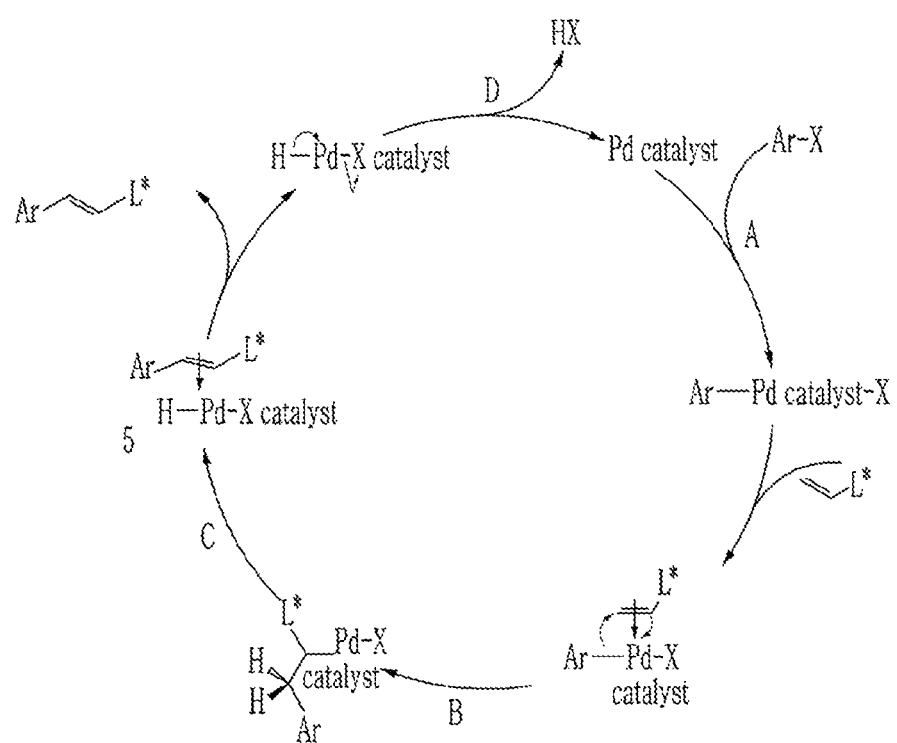
FIG. 1 is a schematic cycle illustrating a reaction (or a polymerization) mechanism carried out in an ink composition according to one or more non-limiting embodiments.

Advantages and characteristics of this disclosure, and a method for achieving the same, will become evident referring to the following example embodiments together with the drawings attached hereto. However, the embodiments should not be construed as being limited to the exemplary embodiments as set forth herein. If not defined otherwise, all terms (including technical and scientific terms) in the specification may be defined as commonly understood by one skilled in the art. The terms defined in a generally used dictionary may not be interpreted ideally or exaggeratedly unless clearly defined. In addition, unless explicitly described to the contrary, the word "comprise" and "include" and variations such as "comprises" or "comprising", and "includes" or "including" will be understood to imply the inclusion of stated elements but not the exclusion of any other elements.

Further, the singular includes the plural unless mentioned otherwise. "At least one" is not to be construed as limiting "a" or "an." "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkyl ester group (—C(=O)OR, wherein R is a C1 to C29 alkyl group), a C7 to C13 aryl ester group (—C(=O)OR, wherein R is a C6 to C12 aryl group), a C3 to C30 alkenyl ester group (—C(=O)OR, wherein R is a C2 to C29 alkenyl group, e.g., an alkenyl ester group such as an acrylate group, a methacrylate group, or the like), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino or amine group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hetero" refers to a compound or group that includes one to three heteroatoms that are N, O, S, Si, Se, P, or a combination thereof.

As used herein, "alkylene group" refers to a straight or branched saturated aliphatic hydrocarbon group having at least two valences and optionally substituted with a substituent. As used herein, "arylene group" refers to a bivalent or polyvalent aromatic group (i.e., a group derived from an arene) that is obtained by removal of a hydrogen atom from at least two ring carbon atoms of the aromatic ring(s), and optionally may be substituted with a substituent. It is to be understood that the term "arene" can be used interchangeably with the term "arylene" herein. As used herein, "alkyl group" refers to a monovalent linear or branched saturated aliphatic hydrocarbon group (e.g., optionally including a substituent).

In addition, "aliphatic hydrocarbon group" or "aliphatic organic group" refers to a C1 to C30 linear or branched hydrocarbon group (e.g., a C1 to C30 alkyl, a C2 to C30 alkenyl, or a C2 to C30 alkynyl), "aromatic hydrocarbon group" or "aromatic organic group" refers to a C6 to C30 aryl group or a C1 to C30 heteroaryl group, and "alicyclic hydrocarbon group" or "alicyclic organic group" refers to a cyclic hydrocarbon group. The alicyclic organic group may include a C3 to C30 cycloalkyl group, a C3 to C30 cycloalkenyl group, or a C3 to C30 cycloalkynyl group.

As used herein, "(meth)acrylate" refers to acrylate and/or methacrylate. The (meth)acrylate may include a (C1 to C10 alkyl)acrylate and/or a (C1 to C10 alkyl)methacrylate.

As used herein, "C1-C10 acyl group" refers to a group of the formula —C(O)R, wherein the carbonyl carbon is not included in the number of carbons (i.e., C1-C10) of the acyl group. For example, —C(O)CH$_3$ is a C1 acyl group.

In an embodiment, "hydrophobic moiety" may refer to an aliphatic hydrocarbon group having a carbon number of 1, 2, or greater (alkyl, alkenyl, alkynyl, etc.), an aromatic hydrocarbon group having a carbon number of 6 or greater (phenyl, naphthyl, alkylaryl, etc.), or an alicyclic hydrocarbon group having a carbon number of 5 or greater (e.g., cyclohexyl, norbornenyl, norbornanyl, tricyclodecyl, etc.).

As used herein, a "dispersion" refers to a solid dispersed phase and a liquid (or solid) continuous phase. For example, a "dispersion" may refer to a colloidal dispersion wherein the dispersed phase has a dimension of greater than or equal to about 1 nanometer (nm) (e.g., greater than or equal to about 10 nm, greater than or equal to about 50 nm, or greater than or equal to about 100 nm) and several micrometers (μm) or less (e.g., less than or equal to about 5 μm, less than or equal to about 4 μm, less than or equal to about 3 μm, less than or equal to about 2 μm, or less than or equal to about 1 μm).

As used herein, "Group" refers to a group of the Periodic Table of Elements.

As used herein, "Group I" refers to Group IA or Group IB, and examples of a Group IA or Group IB may include Li, Na, K, Rb, and Cs, but are not limited thereto.

As used herein, "Group II" refers to Group IIA or Group IIB, and examples of a Group II metal may include Cd, Zn, Hg, and Mg, but are not limited thereto.

As used herein, "Group III" refers to Group IIIA or Group IIIB, and examples of a Group III metal may include Al, In, Ga, and TI, but are not limited thereto.

As used herein, "Group IV" refers to Group IVA or Group IVB, and examples of a Group IV metal may include Si, Ge, and Sn, but are not limited thereto. As used herein, the term "metal" may include a semi-metal such as Si.

As used herein, "Group V" refers to Group VA, and examples of a Group VA may include nitrogen, phosphorus, arsenic, antimony, and bismuth, but are not limited thereto.

As used herein, "Group VI" refers to Group VIA, and examples of a Group VIA may include sulfur, selenium, and tellurium, but are not limited thereto.

A quantum dot is a nano-sized crystalline semiconductor material (also known as nanoparticles). The quantum dot may have a large surface area per unit volume due to a relatively small size of the semiconductor nanocrystal particle and may exhibit different characteristics from a bulk material having the same composition due to a quantum confinement effect. Quantum dots may absorb light from an excitation source to be excited, and may emit energy corresponding to an energy bandgap of the quantum dots. The quantum dots have potential applicability in various devices (e.g., an electronic device or a display device) due to unique photoluminescence characteristics of the quantum dots.

The quantum dot may have different energy bandgaps by controlling sizes and/or compositions of the nanocrystals, and thus can emit light of various photoluminescence wavelengths.

In order to be applied in a display device, the quantum dot may be dispersed in a host matrix (e.g., including a polymer, an inorganic material, or a combination thereof) to form a composite and thus be applied it to an electronic device (e.g., a display device). The absorption type color filter may be replaced with a photoluminescent type color filter to realize a wider viewing angle and improved luminance. A color filter including the quantum dot may achieve increased luminous efficiency and improved color reproducibility. A pattern of a quantum dot polymer composite may be included in a photoluminescent color filter. For the application to the color filter, the quantum dot polymer composite may include a repeating section in a desired position (e.g., in a pixel) that is configured to emit light of a desired wavelength, and thus may be processed into a desired pattern.

As a method of providing a patterned quantum dot polymer composite, there are a photoresist process and an ink jet process. The inkjet process may form a pattern by depositing a droplet discharged composition at a desired position and thus may not require a developing process and less steps in comparison with the photoresist process. In addition, the ink jet process may advantageously consume a material (e.g., quantum dots) in an amount necessary for the formation of the pattern.

However, in order to achieve an effective jetting of an ink composition, viscosity, vapor pressure, surface tension, or the like of the composition may be required to show a desired value for an ink jet process. As used herein, the viscosity may refer to a value that is measured at a predetermined temperature such as room temperature (e.g., a temperature of about 20° C. to 25° C., or about 23° C.). In addition, the quantum dot is a material based on an extremely small sized particle and thus unlike the ink composition for an organic material, in case of the quantum dot based ink composition, maintaining dispersibility of the quantum dot in the composition may be critical. For example, in a quantum dot-based composition, a change caused by a removal (e.g., evaporation) of a solvent may cause a serious defect such as precipitation of the quantum dots that are otherwise dispersed in a medium. Until now, no report has been made for a quantum dot dispersing system for an ink composition that may address the aforementioned problems while providing a high quality of a composite pattern.

Meanwhile, patterning process of an ink jet composition including quantum dots may entail a photopolymerization, and to this end, the quantum dot containing ink jet composition including a photoinitiator therein. The photoinitiator may allow for a polymer matrix to show a desired degree of curing. However, according to the research of the present inventors, a light exposure process to a quantum dot composition including a photoinitiator may be required to carry out a curing of the composition but may cause a substantial quantum efficiency to drop. Without wishing to be bound by any theory, it is believed that a photoinitiator radical that is formed for a monomer polymerization during the light exposure step may interact with a surface defect site of a quantum dot and thus many trap energy level may be made in the quantum dot, which may in turn increase a deep trap emission and reduce a band edge emission of the quantum dot. In addition, when a composition includes a quantum dot having a high level of light absorption rate, it would become difficult to obtain a desired level of a curing degree for a matrix. Thus, it is desired to develop an ink jet system that may provide a polymer matrix exhibiting an enhanced level of mechanical properties and curing degree without the light exposure process.

In an embodiment, an ink composition does not include a volatile organic substance (e.g., an organic solvent) being configured to be removed during a pattern formation. In other words, the ink composition of the embodiment is a solvent-free composition. An ink composition of an embodiment may be used to stably provide a quantum dot polymer composite pattern substantially without causing a change in a quantum dot solubility (or dispersibility) in the composition during the pattern formation (for example, without causing a substantial precipitation of the quantum dots. A polymerization mechanism of an ink composition of an embodiment may not entail a radical formation, and thus it becomes possible to provide a polymer matrix having a desired level of (high) curing degree without the light exposure step.

In an embodiment, an ink composition includes (e.g., a plurality of) quantum dots; a metal catalyst (e.g., a palladium catalyst such as palladium salt and/or a palladium coordination complex); an aromatic halide compound (herein, also can be referred to as aromatic halide); and an ene compound including at least one $sp^2$- or sp-hybridized C—H moiety and a carbon-carbon unsaturated bond. In an ink composition of an embodiment, an amount of the metal or the metal catalyst (e.g., an amount of a transition metal such as palladium or a palladium catalyst) may be less than or equal to about 0.5 moles or less than or equal to about 0.2 moles based on one mole of the ene-compound.

An ink composition of an embodiment may have a colloidal dispersibility. As determined by the DLSA method, the ink composition of the embodiment may exhibit an average particle size of less than or equal to about 5 μm, less than or equal to about 4 μm, less than or equal to about 3 μm, less than or equal to about 2 μm, less than or equal to about 1.5 μm, less than or equal to about 1 um, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, or less than or equal to about 250 nm. As determined by the DLSA method, the ink composition of the embodiment may exhibit an average particle size of greater than or equal to about 5 nm, greater than or equal to about 10 nm, greater than or equal to about 15 nm, greater than or equal to about 20 nm, greater than or equal to about 30 nm, greater than or equal to about 40 nm, greater than or equal to about 50 nm, greater than or equal to about 60 nm, greater than or equal to about 70 nm, greater than or equal to about 80 nm, greater than or equal to about 90 nm, greater than or equal to about 100 nm, greater than or equal to about 110 nm, greater than or equal to about 120 nm, greater than or equal to about 130 nm, greater than or equal to about 140 nm, greater than or equal to about 150 nm, greater than or equal to about 160 nm, greater than or equal to about 170 nm, greater than or equal to about 180 nm, greater than or equal to about 190 nm, greater than or equal to about 200 nm, greater than or equal to about 210 nm, greater than or equal to about 220 nm, greater than or equal to about 230 nm, greater than or equal to about 240 nm, greater than or equal to about 250 nm, greater than or equal to about 260 nm, greater than or equal to about 270 nm, greater than or equal to about 280 nm, greater than or equal to about 290 nm, greater than or equal to about 300 nm, greater than or equal to about 400 nm, greater than or equal to about 500 nm, or greater than or equal to about 600 nm.

The quantum dots, which hereinafter are also referred to as "semiconductor nanocrystals", may be a Group II-VI compound, a Group III-V compound, a Group IV-VI compound, a Group IV element or compound, a Group compound, a Group II-III-VI compound, a Group I-II-IV-VI compound, or a combination thereof.

The Group II-VI compound may be a binary element compound including CdSe, CdTe, ZnS, ZnSe, ZnTe, ZnO, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound including HgZnTeS, CdZnSeS, CdZnSeTe, CdZnSTe, CdHgSeS, CdHgSeTe, CdHgSTe, HgZnSeS, HgZnSeTe, or a combination thereof. The Group II-VI compound may further include a Group III metal. The Group III-V compound may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (e.g., InZnP). The Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPb-STe, or a combination thereof. Examples of the Group compound may include CuInSe$_2$, CuInS$_2$, CuInGaSe, and CuInGaS, but are not limited thereto. The Group VI compound may include ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, but are not limited thereto. Examples of the Group I-II-IV-VI compound may include CuZnSnSe and CuZnSnS, but are not limited thereto. The Group IV element or compound may be a single substance including Si, Ge, or a combination thereof; or a binary element compound including SiC, SiGe, or a combination thereof.

The binary element compound, the ternary element compound, or the quaternary element compound respectively may exist in a uniform concentration in the particle or partially different concentrations in the same particle. The semiconductor nanocrystal may have a core/shell structure wherein a first semiconductor nanocrystal surrounds a second semiconductor nanocrystal that is different from the first semiconductor nanocrystal composition. The core and the shell may have an interface, and an element of the shell in the interface may have a concentration gradient wherein the concentration of the element(s) decreases toward the core. The semiconductor nanocrystal may have a structure including a semiconductor nanocrystal core and a multi-layered shell surrounding the same. Herein, the multi-layered shell may have at least two shells wherein each shell may be a single composition, an alloy, a single composition or an alloy having a concentration gradient, or a combination thereof.

In the quantum dot, the shell semiconductor material and the core semiconductor material may have different energy bandgap from each other. For example, the energy bandgap of the shell semiconductor material may be greater than that of the core semiconductor material. According to another embodiment, the energy bandgap of the shell semiconductor material may less than that of the core semiconductor material. The quantum dot may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

The quantum dots may include a core including a first semiconductor nanocrystal including indium, zinc, or a combination thereof; and a shell disposed on the core and including a second semiconductor nanocrystal having a different composition from the first semiconductor nanocrystal. The quantum dots may not include an undesirable heavy metal such as cadmium, lead, mercury, or the like. The quantum dots may include an indium phosphide, indium zinc phosphide, a zinc selenide, a zinc tellurium selenide, a zinc selenide sulfide, or a combination thereof. As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

The quantum dot may control an absorption/photoluminescence wavelength by adjusting a composition and a size. A maximum photoluminescence peak wavelength of the quantum dot may be an ultraviolet (UV) to infrared ray wavelength or a wavelength of greater than the above wavelength range. For example, the maximum photoluminescence peak wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum photoluminescence wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum photoluminescence wavelength of the quantum dot may be in the range of about 600 nm to about 650 nm. The maximum photoluminescence wavelength of the quantum dot may be in the range of about 500 nm to about 540 nm. The maximum photoluminescence wavelength of the quantum dot may be in the range of about 440 nm to about 490 nm (or to about 480 nm).

The quantum dot may have quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dot may have a relatively narrow spectrum so as improve color purity or color reproducibility. The quantum dot may have for example a full width at half maximum (FWHM) of a photoluminescence wavelength spectrum of less than or equal to about 50 nm, for example, less than or equal to about 45 nm, less than or equal to about 40 nm, or less than or equal to about 30 nm.

The quantum dot may have a particle size (e.g., a diameter or the largest linear length crossing the particle) of greater than or equal to about 1 nm and less than or equal to about 100 nm. The quantum dot may have a particle size of about 1 nm to about 50 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. A shape of the quantum dot is not particularly limited. For example, the shape of the quantum dot may be a sphere, a polyhedron, a pyramid, a multipod, a square, a rectangular parallelepiped, a nanotube, a nanorod, a nanowire, a nanosheet, or a combination thereof, but is not limited thereto.

The quantum dot may be commercially available or may be appropriately synthesized. When the quantum dot is colloid-synthesized, the particle size may be relatively freely controlled and also uniformly controlled.

The quantum dot may include an organic ligand (e.g., having a hydrophobic moiety). The organic ligand moiety may be bound to a surface of the quantum dot. The organic ligand may include $RCOOH$, $RNH_2$, $R_2NH$, $R_3N$, $RSH$, $R_3PO$, $R_3P$, $ROH$, $RCOOR$, $RPO(OH)_2$, $RHPOOH$, $R_2POOH$, or a combination thereof, wherein each instance of R is the same or different and is independently a substituted or unsubstituted C1 to C40 or C3 to C24 or C5 to C24 aliphatic hydrocarbon group such as alkyl or alkenyl; or a substituted or unsubstituted C6 to C20 aromatic hydrocarbon group such as an aryl group.

Examples of the organic ligand include a thiol compound such as methanethiol, ethanethiol, propanethiol, butanethiol, pentanethiol, hexanethiol, octanethiol, dodecanethiol, hexadecanethiol, octadecanethiol, or benzyl thiol; an amine such as methylamine, ethylamine, n-propylamine, isopropylamine, n-butylamine, sec-butylamine, tert-butylamine, pentylamine, hexylamine, octylamine, nonylamine, decylamine, dodecylamine, hexadecylamine, octadecylamine, dimethylamine, diethylamine, dipropylamine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methylphosphine, ethylphosphine, propylphosphine, butylphosphine, pentylphosphine, octylphosphine, dioctyl phosphine, tributylphosphine, trioctylphosphine, diphenyl phosphine, or triphenyl phosphine; a phosphine oxide compound thereof such methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide, a diphenyl phosphine oxide, triphenyl phosphine oxide; C5 to C20 alkyl phosphinic acid; C5 to C20 alkyl phosphonic acid such as hexylphosphonic acid, octylphosphonic acid, dodecanephosphonic acid, tetradecanephosphonic acid, hexadecanephosphonic acid, octadecanephosphonic acid; and the like, but are not limited thereto. The quantum dot may include an organic ligand alone or a combination of organic ligands. In some aspects, the organic ligand does not include a photopolymerizable moiety (e.g., acrylate group, methacrylate group, etc.).

The quantum dots may not include a polysiloxane compound (or a reaction product of an alkoxy silane compound) on a surface thereof.

In an embodiment, an ink composition including monomer system that will be described in detail below may form a polymer matrix via a polymerization mechanism (e.g., without involving a radical generation) different from that of prior arts. In an embodiment, an ink composition may not (substantially) include a volatile organic solvent and (for example, even when it includes an increased amount of quantum dots) it may satisfy various requirements (for example, in terms of viscosity, surface tension, vapor pressure or the like) that are often necessary for an ink jet composition, and it may provide an uniform quantum dot polymer composite film (or a pattern thereof) for example, through a droplet discharging method, without a nozzle-clogging or a phase-separation.

In the composition, an amount of the quantum dots may be, based on a total weight of the composition (or a total solid content of the composition), greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, greater than or equal to about 40 wt %, greater than or equal to about 45 wt %, or greater than or equal to about 50 wt %. In the composition, an amount of the quantum dots may be, based on a total weight of the composition (or a total solid content of the composition), less than or equal to about 60 wt %, less than or equal to about 55 wt %, less than or equal to about 50 wt %, less than or equal to about 45 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %.

In an ink composition of an embodiment, a coupling reaction between the aromatic halide and the carbon-carbon unsaturated bond moiety occurs in the presence of the metal catalyst (or the palladium catalyst) to form a polymer matrix. Therefore, in an embodiment, the ink composition includes a metal catalyst for example, including a transition metal (or a palladium catalyst including a palladium salt or a palladium coordination complex) together with an aromatic halide and an ene compound having at least one C—H moiety and a carbon-carbon unsaturated (e.g., double or triple) bond.

FIG. 1 illustrates a coupling reaction in the presence of a metal catalyst (for example, using a palladium catalyst) that may occur between the aromatic halide and the ene compound in the composition of a non-limiting embodiment, that will be explained in detail below but the embodiments are not limited thereto.

Referring to FIG. 1, step A is oxidative addition, and the palladium of the palladium catalyst is inserted between the aryl moiety (Ar) and the halogen. Then, the palladium may form a phi complex with a carbon-carbon unsaturated bond (in this regard, FIG. 1 and the description thereof explains the mechanism in reference of a carbon-carbon double bond (i.e., alkene) but the same content may be applied to a carbon-carbon triple bond), and in step B, the alkene itself is inserted into a bond between the palladium and a carbon (e.g., from the aryl moiety), and then, in step C, beta hydride elimination occurs to form a new palladium alkene phi complex 5, and this complex is collapsed in a next step, and in step D, a reductive elimination occurs and the palladium catalyst may be revived.

Through the above reaction mechanism, for example, a coupling reaction between the aryl dihalide and monoalkene (or dialkene) may occur successively (in a series), whereby a polymer having a following repeating unit (e.g., an arylene-vinylene repeating unit) may be formed:

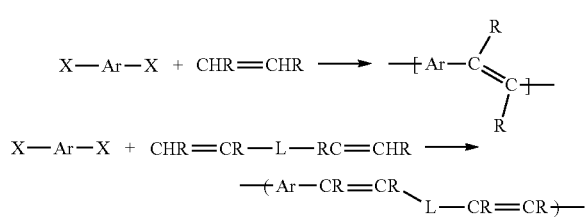

In the above reaction mechanism, the X represents halogen, the Ar represents a (hetero) aromatic hydrocarbon moiety and may correspond to the $Ar^1$ of Chemical Formula 1 and the L represents a portion other than the carbon-carbon double bond in the ene compound and may correspond to the L of Chemical Formula 3.

The aforementioned reaction mechanism does not involve radical generation and thus the ink composition of the embodiment may form a cured polymer matrix without irradiation of an energy ray (e.g., an UV ray). In an embodiment, the ink composition may not substantially include a photoinitiator (that can generate a radical species by the irradiation of an energy ray). As used herein, the expression "not substantially including" refers to the case where a given component is not present or, if present, is included in an amount of less than or equal to about 1 wt %, less than or equal to about 0.5 wt %, less than or equal to about 0.1 wt %, less than or equal to about 0.05 wt %, less than or equal to about 0.01 wt %, less than or equal to about 0.005 wt %, or less than or equal to about 0.001 wt %. As used herein, the expression "not substantially including" refers to the case where the composition does not include the given component. In an embodiment, the photoinitiator may refer to a compound that can form a radical via irradiation of an energy ray and is capable of initiating a radical polymerization. The photoinitiator may include an alkyl phenone compound optionally having a morpholinyl group, a triazine compound, a acetophenone compound, a benzophenone compound, a thioxanthone compound, a benzoin compound, an oxime compound, or a combination thereof.

The present inventors have found that surprisingly, a composition including an aryl halide and an ene compound that can play a role of a monomer combination according to the aforementioned polymerization mechanism may provide a desired level of dispersibility for the quantum dots and at the same time may satisfy various specification (e.g., in terms of a vapor pressure, a surface tension, a boiling point, or a viscosity) that are necessary for the composition to be used in an ink jet process.

The metal catalyst may include a metal salt or a metal coordination complex. The metal catalyst may include a metal that is palladium, nickel, ruthenium, rhodium, iridium, iron, cobalt, chromium, copper, platinum, silver, gold, or a combination thereof.

The metal catalyst may not be in a form of a nanoparticle. The metal catalyst may be dissolved in the aromatic halide and/or the ene compound.

The metal catalyst may include $Pd(OAc)_2$, $Pd(PPh_3)_4$, $PdCl_2$, $PdCl_2[P(o-Tol)_3]_2$, $Ni(acac)_2$, $NiCl_2(dppe)$, $NiCl_2(dppp)$, $NiCl_2(PCy_3)_2$, $NiCl_2(dbpf)$, $NiCl_2(PCy_2Ph)_2$, $NiCl_2(IPr)(PPh_3)$, $Ni(cod)_2$, $RuCl_2(PPh_3)_3$, $CpRuCl(PPh_3)_2$, $RuH_2(CO)(PPh_3)_3$, $Ru(acac)_3$, $[(C_6H_6)RuCl_2]_2$, $[(hmb)RuCl_2]_2$, $[(p-cymene)RuCl_2]_2$, $RuH(PPh_3)_4$, $RhCl(PPh_3)_3$, $RhCl(CO)(PPh_3)_2$, $Rh_2(OAc)_4$, $Rh(nbd)_2(BF_4)$, $[RhCl(nbd)]_2$, $[RhCl(cod)]_2$, $[RhCl(coe)_2]_2$, $[RhCl(ethylene)_2]_2$, $[Cp*RhCl_2]_2$, $[Rh_2(esp)]_2$, $[Ir(cod)(PCy_3)(py)]PF_6$, $[Cp*IrCl_2]_2$, $[IrCl(cod)]_2$, $[Ir(OMe)(cod)]_2$, $IrCl(CO)(PPh_3)_2$, $IrH(CO)(PPh_3)_2$, $Ir(acac)(cod)$, $[IrCl(coe)_2]_2$, $Fe(OAc)_2$, $Fe(acac)_3$, $Fe(hfacac)_3$, $[CpFe(CO)_2]_2$, $Fe(dppd)_3$, $FeCl_3$, $CoCl_2$, $CrCl_2$, $CuI$, $CuO$, $Cu(OAc)_2$, $Cu(acac)_2$, $Cu(tfa)_2$, $Cu(hfacac)_2$, $Cu(acac)(cod)$, $(IMes)CuCl$, $(IPr)CuCl$, $(IPr)Cu(dppd)$, $Cu(OH)(tmeda)Cl_2$, $Pt(PPh_3)_4$, $Pt(P(t-Bu)_3)_2$, $PtCl_2(cod)$, $Pt(acac)_2$, $(IPr)AgCl$, $(IPr)AuCl$, $(PPh_3)AuCl$, or a combination thereof, wherein OAc is acetate, OMe is methoxy, Cy is cyclopentyl, dppd is N,N'-diphenyl-1,4-phenylenediamine, dppe is bis(diphenylphosphine)ethane, dbpf is 1,1'-Bis(diphenylphosphino)ferrocene, dppp is 1,3-Bis(diphenylphosphino)-propane], esp is α,α,α',α'-tetramethyl-1,3-benzenedipropionic acid, hmb is $\eta^6$-$C_6(CH_3)_6$, tmeda is bis(N,N,N',N'-tetramethyl-ethylenediamine), acac is acetylacetonate, hfacac is hexafluoroacetylacetonate, Cp is $\eta^5$-cyclopentadienyl, Cp* is $\eta^5$-$C_5(CH_3)_5$, coe is cis-cyclooctene, cod is 1,5-cyclooctadiene, nbd is bis[η-(2,5-norbornadiene), tfa is trifluoroacetate, Ph is phenyl, o-Tol is ortho-toluoyl, IMes is 1,3-Bis(2,4,6-trimethylphenyl)imidazol-2-ylidene, IPr is 1,3-bis(2,6-diisopropylphenyl)imidazole-2-ylidene, t-Bu is tertiary butyl, and py is pyridyl.

The metal catalyst may include a palladium catalyst. The palladium catalyst may be a palladium salt, a palladium coordination complex, or a combination thereof. The palladium catalyst may be a palladium(0) compound (i.e., a zero-valent palladium compound), a palladium(II) compound, or a combination thereof. The palladium catalyst may further include a base compound, a supporting ligand, or a combination thereof.

The polymerization reaction may be carried out in the absence of an amine (e.g., an organic amine). The polymerization reaction may be carried out in the presence of an amine (e.g., an organic amine).

If present, types of the (organic) amine are not particularly limited and may include an organic amine having at least one (two or three) substituted or unsubstituted C1 to C40 alkyl group. An amount of an amine in the composition may be selected appropriately taking an amount of the ene compound having the carbon-carbon unsaturated bond. In an embodiment, an amount of the amine may be, based on one mole of the ene group (for example, in case of a multi-acrylate compound, one mole of the acrylate groups), greater than or equal to about 0.01 moles, greater than or equal to about 0.05 moles, greater than or equal to about 0.1 moles, greater than or equal to about 0.5 moles, or greater than or equal to about 0.7 moles, and less than or equal to about 10 moles, less than or equal to about 5 moles, less than or equal to about 2 moles, less than or equal to about 1 mole, less than or equal to about 0.9 moles, less than or equal to about 0.6 moles, or less than or equal to about 0.1 moles.

The zero-valent palladium(0) compound may include tetrakis (triarylphosphine)palladium(0). The palladium(II) compound may include a palladium(II) halide such as palladium(II) chloride; palladium(II) bromide; palladium(II) iodide; a palladium(II) organic acid ester such as a palladium (II) carboxylate, palladium acetate, or a combination thereof; a palladium(II) inorganic ester; or a combination thereof.

The base compound may include a tertiary amine (e.g., a trialkyl amine such as triethyl amine, tributyl amine, or the like); an alkali earth metal carbonate or an alkali metal carbonate such as potassium carbonate; an alkali metal carboxylate or an alkali earth metal carboxylate such as magnesium carboxylate, or a combination thereof. The organic amine may include a C1 to C40 mono, di, tri alkyl amine. The organic amine may be a tertiary amine such as a trialkyl amine (e.g., trimethyl amine, triethyl amine, tributyl amine, or the like).

The supporting ligand may include an organic compound (e.g., a phosphorous-containing compound) such as a trialkyl phosphine, a friaryl phosphine, an organic amine, a phosphinooxazoline, a phosphinooxazoline ester, or the like, acetylacetonate, or a combination thereof. The friaryl phosphine may be triphenyl phosphine, tri(o-tolyl)phosphine, or a combination thereof. The organic amine may include a C1 to C40 mono-, di-, tri-alkyl amine.

In the composition, an amount of the metal (e.g., palladium) (or an amount of the metal catalyst) may be less than or equal to about 0.5 moles, per one mole of the ene compound. The amount of the metal (e.g., palladium) may be less than or equal to about 0.2 moles, per one mole of the ene compound.

In the composition, the amount of the metal (e.g., the palladium) (or an amount of the metal catalyst) may be, based on one mole of the ene compound, greater than or equal to about 0.00005 moles, greater than or equal to about 0.0001 moles, greater than or equal to about 0.0002 moles, greater than or equal to about 0.0003 moles, greater than or equal to about 0.0004 moles, greater than or equal to about 0.0005 moles, greater than or equal to about 0.0006 moles, greater than or equal to about 0.0007 moles, greater than or equal to about 0.0008 moles, greater than or equal to about 0.0009 moles, greater than or equal to about 0.001 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, or greater than or equal to about 0.01 moles.

In the composition, an amount of the metal (e.g., palladium) may be, based on one mole of the ene compound, less than or equal to about 0.45 moles, less than or equal to about 0.35 moles, less than or equal to about 0.25 moles, less than or equal to about 0.15 moles, less than or equal to about 0.1 moles, less than or equal to about 0.09 moles, less than or equal to about 0.08 moles, less than or equal to about 0.07 moles, less than or equal to about 0.06 moles, less than or equal to about 0.05 moles, less than or equal to about 0.04 moles, less than or equal to about 0.03 moles, or less than or equal to about 0.02 moles.

In an ink composition of an embodiment, an amount of the metal catalyst may be, based on a total weight of the ink composition, greater than or equal to about 0.01 wt %, greater than or equal to about 0.05 wt %, greater than or equal to about 0.1 wt %, greater than or equal to about 0.15 wt %, greater than or equal to about 0.2 wt %, greater than or equal to about 0.25 wt %, greater than or equal to about 0.3 wt %, greater than or equal to about 0.35 wt %, greater than or equal to about 0.4 wt %, or greater than or equal to about 0.45 wt %. In an ink composition of an embodiment, an amount of the metal catalyst may be, based on a total weight of the ink composition, less than or equal to about 5 wt %, less than or equal to about 4 wt %, less than or equal to about 3 wt %, less than or equal to about 2 wt %, less than or equal to about 1 wt %, or less than or equal to about 0.9 wt %.

In the composition, an amount (amounts) of the base compound and/or the supporting ligand may be selected appropriately considering the molar amount of the metal in the metal catalyst (e.g., the palladium) and is (or are) not particularly limited.

In the composition of one or more embodiments, the aromatic halide compound may include a first aromatic halide (or referred to as first aromatic halide compound) having a first center aromatic moiety and at least two halogen groups linked to the first center aromatic moiety. The aromatic halide compound may further include a second aromatic halide (or referred to as second aromatic halide compound) having a second center aromatic moiety, a single halogen group linked to the second center aromatic moiety and a hydrophobic moiety. The first center aromatic moiety and the second center aromatic moiety may be the same or different with each other. The first center aromatic moiety and the second center aromatic moiety may include at least one of moieties (groups) set forth in the definition of "Ar" of Chemical Formula 1 as described herein. As used herein, the halogen moiety may include fluorine, bromine, chlorine, iodine, or a combination thereof. The first aromatic halide compound, the second aromatic halide compound, or a combination thereof may be a compound having a hydrophobic moiety. Without wishing to be bound by any theory, the hydrophobic moiety may help dispersing the quantum dots in the composition. The hydrophobic moiety may include a substituted or unsubstituted C3 to C50 aliphatic hydrocarbon group (e.g., alkyl, alkenyl, or alkynyl), a substituted or unsubstituted C6 to C50 aromatic hydrocarbon group, —COOR (wherein R is a substituted or unsubstituted C1 to C30 alkyl), —SiR$_3$ (wherein R is the same or different and is a C1 to C30 alkyl group), or a combination thereof.

The first aromatic halide may include at least two, three, or four same or different halogen moieties. The first aromatic halide may include a compound represented by Chemical Formula 1:

Chemical Formula 1

in the above chemical formula, each R independently is a substituted or unsubstituted C1 to C30 alkyl group; a substituted or unsubstituted C2 to C30 alkyl group in which at least one methylene is replaced with a carbonyl group, an ether group, an ester group, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, Ar is a substituted or unsubstituted C6 to C40 arene (e.g., a benzene group or a naphthalene group) (e.g., a substituted or unsubstituted C6 to C40 arylene optionally with at least one, two, or three or more substituted or unsubstituted aryl substituent), a substituted or unsubstituted C3 to C40 heteroarene (e.g., a substituted or unsubstituted C3 to C40 heteroarylene), a substituted or unsubstituted C9 to C40 polycyclic aromatic hydrocarbon (e.g., fluorene), a substituted or unsubstituted C9 to C40 polycyclic heteroaromatic hydrocarbon, or a group having two or three arenes linked through nitrogen or a nitrogen containing moiety with each other, X is F, Cl, Br, I, or a combination thereof, n is an integer of 2 or greater (e.g., 2, 3, 4 or higher).

The m and the n are determined considering the valency of the Ar.

The first aromatic halide may include a compound represented by the chemical formula:

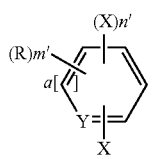

In the above chemical formula, each R independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group; a is an integer of greater than or equal to about 1 and less than or equal to about 10; Y is CH or N; each X is the same or different and may be Cl, Br, or I; n' is an integer of 1 or greater; m' is 0 or an integer of 1 or greater.

The first aromatic halide may include a compound represented by any one of chemical formulas as below:

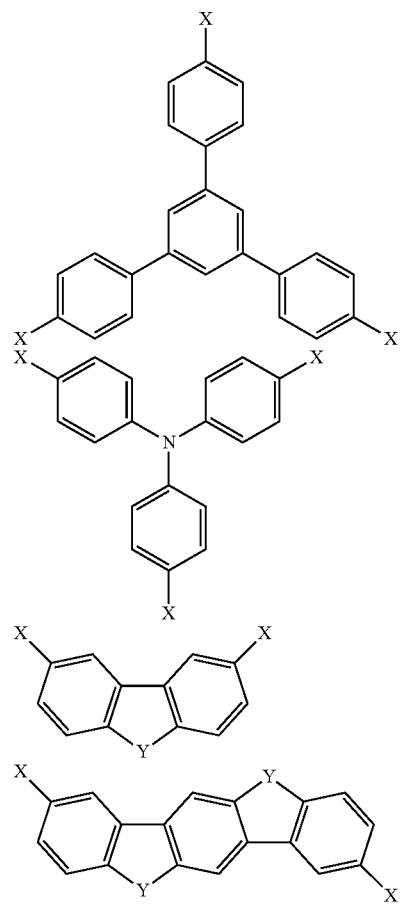

In the above chemical formulae, an aromatic ring may optionally have at least one substituent selected from a substituted or unsubstituted C1 to C30 alkyl group, a substituted or unsubstituted C2 to C30 alkyl group in which at least one methylene is replaced with carbonyl, ether, ester, or a combination thereof, a substituted or unsubstituted C1 to C30 alkoxy group, a trialkylsilyl group, a substituted or unsubstituted C6 to C40 aryl group, a substituted or unsubstituted C3 to C40 heteroaryl group, or a combination thereof; Y is a $C_nH_{2n}$ (n is 0 or an integer of greater than or equal to about 1 and less than or equal to about 10), NR, O, or S; X is the same or different and may include Cl, Br, I, or a combination thereof.

The m' and the n' may be determined considering the valency of the aromatic ring moiety.

The first aromatic halide may include a compound represented by the following formula:

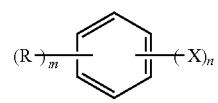

R, m, X, and n are the same as set forth above.

The first aromatic halide may include a dibromoaryl compound (e.g., dibromoxylene or dibrobenzene), a dichloroaryl compound (e.g., dichloroxylene or dichlorobenzene), a diiodoaryl compound (e.g., diiodoxylene or diiodobenzene), or a combination thereof.

The second aromatic halide may include a compound represented by Chemical Formula 2:

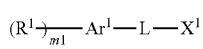

Chemical Formula 2 in the above chemical formula, each $R^1$ independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m1 is 0 or an integer of 1 or greater $Ar^1$ is a substituted or unsubstituted C6 to C40 arene (e.g., a substituted or unsubstituted C6 to C40 arene with at least one, two, or three or more substituted or unsubstituted aryl substituent), a substituted or unsubstituted C3 to C40 heteroarene, a substituted or unsubstituted C9 to C40 polycyclic aromatic hydrocarbon (e.g., fluorene), a substituted or unsubstituted C9 to C40 polycyclic heteroaromatic hydrocarbon, or a group having two or three arenes linked through nitrogen or a nitrogen containing moiety with each other, $X^1$ is F, Cl, Br, or I, L is a direct bond, a substituted or unsubstituted C1 to C10 alkylene, or an alkyne moiety.

The m1 may be determined considering the valency of the Ar.

In Chemical Formula 2, each $R^1$ independently may be a substituted or unsubstituted C8 or greater alkyl group, a substituted or unsubstituted C2 or greater alkylester group, a substituted or unsubstituted C8 or greater alkoxy group, a trimethylsilyl group, or a triethylsilyl group.

The second aromatic halide may be a compound represented by any of Chemical formula as below:

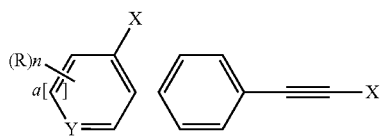

In the above chemical formulae, R is a substituted or unsubstituted C1 to C30 alkyl group, a substituted or unsubstituted C2 to C30 alkyl group in which at least one methylene is replaced with carbonyl, ether, ester, or a combination thereof (e.g., —$CH_2$—O—$C_nH_{2n+1}$), a substituted or unsubstituted C1 to C30 alkoxy group, a substituted or unsubstituted C1 to C30 alkyl ester group, (e.g., R'OCO, R' is a substituted or unsubstituted C1 to C30 alkyl group), a trialkylsilyl group, or a combination thereof, a is an integer of about 1 to 10, and n is 0 or an integer of 1 or greater, Y is CH, or N, X is F, Cl, Br, or I.

The second aromatic halide may include a haloanisole such as bromoanisole, a halotrialkyl silyl benzene such as a bromo trimethylsilyl benzene, a haloalkyl benzene (e.g., bromo alkyl benzene such as bromo dodecyl benzene, bromo hexylbenzene), an alkylhalobenzoate such as ethyl bromo benzoate, methylbromo methylbenzoate, or a combination thereof.

The ene compound may include at least one (or at least two) carbon-carbon unsaturated bond (e.g., a carbon-carbon double bond or a carbon-carbon triple bond). The ene compound may include a first ene compound including at least two carbon-carbon unsaturated bonds and optionally a second ene compound including a single carbon-carbon unsaturated bond.

The first ene compound, the second ene compound, or a combination thereof may be a compound having a hydrophobic moiety. Without wishing to be bound by any theory, the hydrophobic moiety may help dispersing the quantum dots in the composition. The hydrophobic moiety may include a substituted or unsubstituted C3 to C50 aliphatic hydrocarbon (e.g., alkyl, alkenyl, or alkynyl), a substituted or unsubstituted C6 to C50 aromatic hydrocarbon, an (or for example, at least one, at least two and less than or equal to about 100, 50, 40, 30, 20, or lower) ethylene oxide repeating unit, a (for example, at least one, at least two and less than or equal to about 100, 50, 40, 30, 20, or lower) propylene oxide repeating unit, a bisphenol A moiety, a —$SiR_3$ group (wherein R is the same or different and is a substituted or unsubstituted C1 to C30 alkyl group), or a combination thereof.

The first ene compound may include a compound represented by Chemical Formula 3:

Chemical Formula 3 in the above Chemical Formula 3, each R independently is a substituted or unsubstituted C1 to C30 alkyl group; a substituted or unsubstituted C2 to C30 alkyl group in which at least one methylene is replaced with carbonyl, ether, ester, or a combination thereof; a C1 to C30 substituted or unsubstituted alkoxy group; a trialkylsilyl group; a substituted or unsubstituted C6 to C40 aryl group; or a substituted or unsubstituted C3 to C40 heteroaryl group, m is 0 or an integer of 1 or greater, L is a carbon atom, a substituted or unsubstituted C1 to C50 alkylene group, sulfonyl (—$SO_2$—), carbonyl (CO), ether (—O—), sulfide (—S—), sulfoxide (—SO—), ester (—C(=O)O—), amide (—C(=O)NR'—) wherein R' is hydrogen or a C1 to C10 alkyl, a bisphenyl A moiety, a substituted or unsubstituted C6 to C40 arylene (e.g., a C6 to C40 arylene optionally substituted with at least one aryl group), a substituted or unsubstituted C3 to C40 heteroarene (e.g., a substituted or unsubstituted C3 to C40 heteroarylene), a substituted or unsubstituted C9 to C40 polycyclic aromatic hydrocarbon, a substituted or unsubstituted C9 to C40 polycyclic heteroaromatic hydrocarbon, or a combination thereof, each A independently is a direct bond, a substituted or unsubstituted C1 to C50 alkylene group, sulfonyl (—$SO_2$—), carbonyl (CO), ether (—O—), sulfide (—S—), sulfoxide (—SO—), ester (—C(=O)O—), amide (—C(=O)NR"—) wherein R" is hydrogen or a C1 to C10 alkyl, or a combination thereof, each E is the same or different each other, and is a (meth)acrylate, —CR=$CHR^a$, or —C≡CH, wherein R and $R^a$ is each independently hydrogen, a substituted or unsubstituted C1 to C10 alkyl group, and n is an integer of 2 or greater.

The first ene compound may include a compound represented by any of the following chemical formulae:

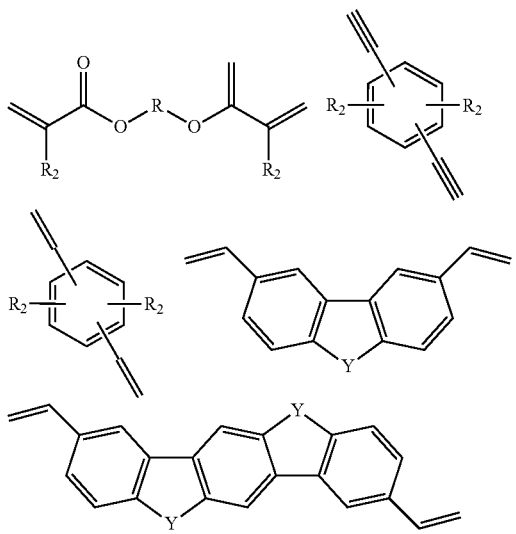

in the above chemical formula, R is a moiety having at least one (e.g., at least two, at least three, at least four, or greater and less than or equal to about 50, 40, 30, 20, 10, or less) C1 to C10 alkylene oxide repeating unit, a substituted or unsubstituted C1 to C40 alkylene moiety, a moiety including a bisphenol A group, or a combination thereof, $R_2$ is the same or different and hydrogen, a substituted or unsubstituted C1 to C10 alkyl group, or a combination thereof, and Y is $CH_2$, NR, S, O, or a combination thereof.

The second ene compound may include a compound represented by Chemical Formula 4-1 or Chemical Formula 4-2:

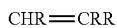  Chemical Formula 4-1

  Chemical Formula 4-2 in the above Chemical Formulae 4-1 and 4-2, each R is the same or different and is hydrogen, $C(O)OR^1$, $O—C(O)—R^1$, a substituted or unsubstituted C1 to C30 alkyl group, or a substituted or unsubstituted C6 to C20 aryl group wherein each $R^1$ is a substituted or unsubstituted C1 to C30 alkyl group.

The second ene compound may include a compound represented by any of the following chemical formulae:

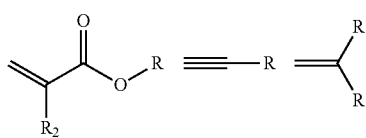

in which $R_2$ is hydrogen or a substituted or unsubstituted C1 to C10 alkyl group, each R is the same or different from one another and is independently hydrogen or a substituted or unsubstituted C1 to C30 (or C1 to C10) alkyl group.

The first ene compound may include an ethylene glycol oligomer including at least two (meth)acrylate groups, a propylene glycol oligomer including at least two (meth)acrylate groups, a bisphenol A glycerolate di(meth)acrylate, neopentylglycol di(meth)acrylate, or a combination thereof.

The second ene compound may include a (meth)acrylate including a C3 to C30 alkyl group, a vinyl compound including a C3 to C30 alkyl group, or a combination thereof.

The ink composition may include a single compound represented by Chemical Formula 5 for the ene compound and the aromatic halide compound:

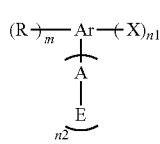  Chemical Formula 5 in the above Chemical Formula 5, each R independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, Ar is a substituted or unsubstituted C6 to C40 arene or arylene (for example, substituted or unsubstituted benzene or naphthalene), a C6 to C40 arylene substituted with at least one aryl group, a substituted or unsubstituted C3 to C40 heteroarene (e.g., a substituted or unsubstituted C3 to C40 heteroarylene), a substituted or unsubstituted C9 to C40 polycyclic aromatic hydrocarbon, a substituted or unsubstituted C9 to C40 polycyclic heteroaromatic hydrocarbon, or a moiety having two or three arylene groups that are linked by a nitrogen containing moiety with each other, each X independently is F, Cl, Br, or I, each A is a direct bond, a substituted or unsubstituted C1 to C50 alkylene group, sulfonyl (—$SO_2$—), carbonyl (CO), ether (—O—), sulfide (—S—), sulfoxide (—SO—), ester (—C(=O)O—), amide (—C(=O)NR'—) wherein R' is hydrogen or a C1 to C10 alkyl, or a combination thereof, each E is the same or different each other, and is a (meth)acrylate, —CR=$CHR^a$, or —C≡CH, wherein $R^a$ is hydrogen or a substituted or unsubstituted C1 to C10 alkyl group, n1 is an integer of 1 or greater; and n2 is an integer of 1 or greater.

n1 and n2 may be determined considering the valency of the Ar.

In some embodiments in Chemical Formula 5, each R independently may be a substituted or unsubstituted C8 or greater alkyl group, a substituted or unsubstituted C2 or greater alkylester group, a substituted or unsubstituted C8 or greater alkoxy group, a trimethylsilyl group, a triethylsilyl group, or a combination thereof.

The single compound may include a compound represented by any of the following chemical formulae:

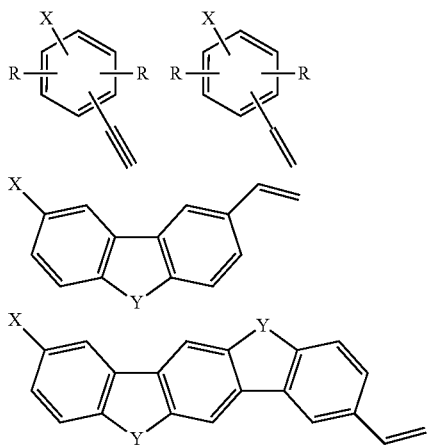

In the above formulae, each R independently is a substituted or unsubstituted C1 to C30 alkyl group, a substituted or unsubstituted C2 to C30 alkyl group in which at least one methylene is replaced with carbonyl, ether, ester, or a combination thereof, a substituted or unsubstituted C1 to C30 alkoxy group, a trialkylsilyl group, a substituted or unsubstituted C6 to C40 aryl group, or a substituted or unsubstituted C3 to C40 heteroaryl group, X is F, Cl, Br, I, or a combination thereof, Y is $C_nR''_{2n}$ (n is 0 or an integer of 1 or greater), NR'', O, or S (R'' is a substituted or unsubstituted C1 to C10 alkyl group or hydrogen).

The composition including the above aromatic halide and the ene compound may provide dispersibility necessary for the quantum dots while satisfying various requirements for the application to the ink jet process. In addition, the monomers (i.e., the aromatic halide and the ene compound) may have relatively high reactivity and thus treating a composition film formed via an ink jet process under a relatively mild condition (e.g., at a temperature of less than or equal to about 180° C. or less than or equal to about 150° C.) may provide a quantum dot polymer composite pattern. The formed pattern or the polymer may exhibit enhanced thermal stability.

In the ink composition of the embodiment, an amount of the aromatic halide compound (e.g., the first aromatic halide compound, the second aromatic halide compound, or a combination thereof) may be, based on a total weight of the composition, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, greater than or equal to about 30 wt %, greater than or equal to about 31 wt %, greater than or equal to about 32 wt %, greater than or equal to about 33 wt %, greater than or equal to about 34 wt %, greater than or equal to about 35 wt %, or greater than or equal to about 36 wt %. In the ink composition of the embodiment, the amount of the aromatic halide compound (the first aromatic halide compound, the second aromatic halide compound, or a combination thereof) may be, less than or equal to about 70 wt %, less than or equal to about 65 wt %, less than or equal to about 60 wt %, less than or equal to about 55 wt %, less than or equal to about 50 wt %, or less than or equal to about 45 wt %, based on a total weight of the composition.

In an embodiment, an amount of the first aromatic halide compound may be less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %.

If present, an amount of the second aromatic halide compound may be greater than (or less than) an amount of the first aromatic halide compound.

Per one mole of the first aromatic halide compound, an amount of the second aromatic halide compound may be greater than or equal to about 0.5 moles, greater than or equal to about 1 mole, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, greater than or equal to about 5 moles, greater than or equal to about 5.5 moles, greater than or equal to about 6 moles, greater than or equal to about 6.5 moles, greater than or equal to about 7 moles, greater than or equal to about 7.5 moles, greater than or equal to about 8 moles, greater than or equal to about 8.5 moles, or greater than or equal to about 9 moles. Per one mole of the first aromatic halide compound, the amount of the second aromatic halide compound may be less than or equal to about 40 moles, less than or equal to about 30 moles, less than or equal to about 20 moles, less than or equal to about 15 moles, less than or equal to about 10 moles, less than or equal to about 5 moles, less than or equal to about 3 moles, less than or equal to about 2 moles, or less than or equal to about 1 moles.

In the ink composition, an amount of the ene compound (the first ene compound, the second ene compound, or a combination thereof) may be, based on a total weight of the ink composition, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, greater than or equal to about 30 wt %, greater than or equal to about 31 wt %, greater than or equal to about 32 wt %, greater than or equal to about 33 wt %, greater than or equal to about 34 wt %, greater than or equal to about 35 wt %, or greater than or equal to about 36 wt %. In the ink composition, the amount of the ene compound (the first ene compound, the second ene compound, or a combination thereof) may be, based on a total weight of the composition, less than or equal to about 70 wt %, less than or equal to about 65 wt %, less than or equal to about 60 wt %, less than or equal to about 55 wt %, less than or equal to about 50 wt %, or less than or equal to about 45 wt %.

If present, an amount of the second ene compound may be greater than (or less than) an amount of the first ene compound. Per one mole of the first ene compound, an amount of the second ene compound may be greater than or equal to about 0.1 moles, greater than or equal to about 0.3 moles, greater than or equal to about 0.5 moles, greater than or equal to about 1 mole, greater than or equal to about 1.2 moles, greater than or equal to about 1.3 moles, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, greater than or equal to about 4.5 moles, greater than or equal to about 5 moles, greater than or equal to about 5.5 moles, greater than or equal to about 6 moles, greater than or equal to about 6.5 moles, greater than or equal to about 7 moles, greater than or equal to about 7.5 moles, greater than or equal to about 8 moles, greater than or equal to about 8.5 moles, greater than or equal to about 9 moles, greater than or equal to about 9.5 moles, greater than or equal to about 10 moles, greater than or equal to about 11 moles, or greater than or equal to about 12 moles. Per one mole of the first ene compound, an amount of the second ene compound may be less than or equal to about 40 moles, less than or equal to about 30 moles, less than or equal to about 20 moles, less than or equal to about 15 moles, less than or equal to about 10 moles, less than or equal to about 5 moles, less than or equal to about 3 moles, less than or equal to about 2 moles, or less than or equal to about 1 moles.

A mole ratio between the aromatic halide compound and the ene compound may be selected considering properties of the ink composition and desired properties of a final polymer.

Per one mole of the aromatic halide compound, an amount of the ene compound may be greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles.

Per one mole of the aromatic halide compound, an amount of the ene compound may be less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1.5 moles, less than or equal to about 1 moles, less than or equal to about 0.9 moles, less than or equal to about 0.8 moles, less than or equal to about 0.7 moles, less than or equal to about 0.6 moles, less than or equal to about 0.5 moles, less than or equal to about 0.4 moles, less than or equal to about 0.3 moles, less than or equal to about 0.2 moles, or less than or equal to about 0.1 moles.

The ink composition may further include a metal oxide particle or a plurality of metal oxide particles. The metal oxide particle(s) may have an average particle size of greater than or equal to about 100 nm, greater than or equal to about 150 nm, greater than or equal to about 180 nm, or greater than or equal to about 190 nm and less than or equal to about 500 nm less than or equal to about 400 nm, or less than or equal to about 300 nm. The metal oxide particle may include a titanium oxide, a silicon oxide, a barium oxide, a zinc oxide, a hafnium oxide, a zirconium oxide, an aluminum oxide, a gallium oxide, an indium oxide, a germanium oxide, a tin oxide, an antimony oxide, a scandium oxide, an yttrium oxide, a lanthanum oxide, a ruthenium oxide, a cerium oxide, a tantalum oxide, a niobium oxide, or a combination thereof.

If present, in the ink composition, an amount of the metal oxide particle may be greater than or equal to about 0.5 wt %, greater than or equal to about 1 wt %, greater than or equal to about 1.5 wt %, greater than or equal to about 2 wt %, greater than or equal to about 2.5 wt %, or greater than or equal to about 3 wt % and less than or equal to about 20 wt %, less than or equal to about 15 wt %, or less than or equal to about 10 wt %, based on a total weight of the composition.

The composition of one or more embodiments may satisfy various properties required in the ink jet process.

The composition of one or more embodiments may have a viscosity (e.g., at room temperature or at a temperature of about 20° C. to 25° C. or about 23° C.) of less than or equal to about 20 centipoise (cP), less than or equal to about 19 cP, less than or equal to about 18 cP, less than or equal to about 17 cP, less than or equal to about 16 cP, less than or equal to about 15 cP, less than or equal to about 14 cP, less than or equal to about 13 cP, less than or equal to about 12 cP, less than or equal to about 11 cP, less than or equal to about 10 cP, less than or equal to about 9 cP, or less than or equal to about 8 cP. The composition of the embodiment may have a viscosity (e.g., at room temperature or at a temperature of about 20° C. to 25° C. or about 23° C.) of greater than or equal to about 2 cP, greater than or equal to about 3 cP, greater than or equal to about 4 cP, greater than or equal to about 5 cP, greater than or equal to about 6 cP, or greater than or equal to about 7 cP.

The composition of the embodiment may have a vapor pressure at 20° C. of less than or equal to about 3 mmHg, less than or equal to about 1.5 mmHg, less than or equal to about 1 mmHg, less than or equal to about 0.9 mmHg, less than or equal to about 0.8 mmHg, less than or equal to about 0.7 mmHg, less than or equal to about 0.6 mmHg, less than or equal to about 0.5 mmHg, less than or equal to about 0.4 mmHg, less than or equal to about 0.3 mmHg, less than or equal to about 0.2 mmHg, less than or equal to about 0.15 mmHg, or less than or equal to about 0.1 mmHg.

The composition of the embodiment may have a boiling point of greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., or greater than or equal to about 220° C., greater than or equal to about 230° C., greater than or equal to about 240° C., greater than or equal to about 250° C., greater than or equal to about 260° C., greater than or equal to about 270° C., or greater than or equal to about 280° C. The composition of the embodiment may have a boiling point of less than or equal to about 350° C., less than or equal to about 340° C., less than or equal to about 330° C., less than or equal to about 320° C., less than or equal to about 310° C., less than or equal to about 305° C., or less than or equal to about 300° C.

The ink composition of the embodiment may be configured to be sprayed out through a nozzle with an opening width of less than or equal to about 40 μm (micrometer), less than or equal to about 30 um, less than or equal to about 20 μm, less than or equal to about 10 μm, or less than or equal to about 5 μm substantially without causing a clogging.

The ink composition of the embodiment may have (for example, at 23° C.) a surface tension of greater than or equal to about 15 millinewtons per meter (mN/m), greater than or equal to about 18 mN/m, greater than or equal to about 20 mN/m, greater than or equal to about 23 mN/m, greater than or equal to about 25 mN/m, greater than or equal to about 28 mN/m, greater than or equal to about 30 mN/m, greater than or equal to about 31 mN/m, greater than or equal to about 32 mN/m, or greater than or equal to about 33 mN/m. The ink composition of the embodiment may have the surface tension of less than or equal to about 50 mN/m, less than or equal to about 45 mN/m, or less than or equal to about 40 mN/m.

The ink composition of the embodiment may be prepared by mixing the aforementioned components. The order and the manner of mixing are not particularly limited.

For a formation of a quantum dot polymer composite or a pattern thereof, developing a composition that allows an ink jet process would be desirable. Formation of the quantum dot polymer composite or a pattern thereof using an ink jet process may provide a high precision pattern without involving (or with exclusion of) a developing process, which may in turn reduce occurrence of defects such as an undercut or shape defect in a resulting pattern. In addition, the ink jet printing may reduce a consumed amount of a material (e.g., quantum dots), decreasing a total production cost and providing a pattern with a high solid content, for example, that includes an increased amount of quantum dots and a light diffusing (or light scattering) agent (e.g., a titanium oxide particles or the like) that will be described herein below. In addition, the ink jet process may allow a control of a pattern thickness with a more readily manner and may provide a pattern having a thickness of greater than or equal to about 8 micrometers with a good shape property. In addition, the number of the step may decrease and a large area pattern may be readily prepared by using an ink jet process. The ink composition of the embodiment may provide a quantum dot polymer composite or a pattern thereof via the ink jet process.

In other embodiments, a method of producing a quantum dot polymer composite pattern includes depositing the ink composition of an embodiment on a substrate, for example via a droplet discharging apparatus, to form a patterned composition film; and reacting the aromatic halide compound and the ene compound. For example, in some aspects the method does not involve a (substantial) removal of a volatile organic (e.g., the aromatic halide compound and the ene compound).

The droplet discharging apparatus is commercially available and details thereof are known and are not particularly limited. The ink composition may be discharged on the substrate through a nozzle of the droplet discharging apparatus to form a film having a predetermined pattern. The nozzle may have an appropriately selected shape and size without a particular limit. The nozzle has a hole (i.e., an orifice) having a diameter of greater than or equal to about 15 micrometer (μm), for example, greater than or equal to about 20 μm, greater than or equal to about 30 μm, greater than or equal to about 40 μm and less than or equal to about 100 μm, for example, less than or equal to about 90 μm, less than or equal to about 80 μm, less than or equal to about 70 μm, but is not limited thereto. The ink composition according to an embodiment may be sprayed without clogging through an orifice having a diameter of about 40 μm.

The method may form a quantum dot polymer composite pattern without using a mask corresponding to the pattern, and thus provides a thin film using a method with high productivity. In addition, since compositions, each having a different composition, may be discharged from each nozzle, a pattern having repetitive red and green light emitting sections may be obtained by preparing ink compositions respectively emitting light of a different wavelength (e.g., red and green) and discharging them through a plurality of nozzles through a reduced recovery process. In addition, the pattern may be formed without a development process, and thus desirably reduce a consumption amount of a material.

The quantum dot polymer composite film (or pattern) formed from the above ink composition may include an increased amount of quantum dots. A thickness of the pattern may be, greater than or equal to about 5 μm, greater than or equal to about 6 μm, greater than or equal to about 7 μm, greater than or equal to about 8 μm, greater than or equal to about 9 μm, greater than or equal to about 10 μm, greater than or equal to about 11 μm, greater than or equal to about 12 μm, greater than or equal to about 13 μm, greater than or equal to about 14 μm, or greater than or equal to about 15 μm. A thickness of the pattern may be less than or equal to about 40 μm, less than or equal to about 30 μm, less than or equal to about 20 μm, less than or equal to about 15 μm, less than or equal to about 6 μm.

The reaction between the aromatic halide compound and the ene compound (or the polymerization involving the same) may be carried out at a temperature greater than or equal to about 80° C., greater than or equal to about 90° C., or greater than or equal to about 100° C., and less than or equal to about 180° C., or less than or equal to about 150° C. In another embodiment, the temperature may be greater than or equal to about 150° C., greater than or equal to about 160° C., greater than or equal to about 170° C., or greater than or equal to about 180° C. and less than or equal to about 230° C., less than or equal to about 220° C., less than or equal to about 210° C., less than or equal to about 200° C., or less than or equal to about 190° C.

The composition of the embodiment may not require irradiation of an energy ray for the above reaction and thus exclude possibility of a decrease in a luminous efficiency that may be caused by a light exposure in the presence of a photoinitiator. Duration for the reaction is not particularly limited and may be greater than or equal to about 1 minute, greater than or equal to about 5 minutes, greater than or equal to about 10 minutes, greater than or equal to about 15 minutes, and less than or equal to about 50 minutes, or less than or equal to about 40 minutes.

In another embodiment, a quantum dot polymer composite (or a pattern thereof) may include a polymer matrix and a plurality of quantum dots dispersed therein, and a metal catalyst (e.g., a palladium catalyst) or a substance derived therefrom (e.g., palladium), wherein the polymer matrix may include a polymer formed by a coupling reaction between an aromatic halide compound and an ene compound having at least one a C—H moiety and a carbon-carbon unsaturated bond. In the quantum dot polymer composite, an amount of the metal (or the palladium) may be greater than zero wt % and less than or equal to about 10 wt %, based on a total weight of the composite. In the composite of an embodiment, an amount of the metal catalyst may be, based on a total weight of the composite, greater than or equal to about 0.01 wt %, greater than or equal to about 0.05 wt %, greater than or equal to about 0.1 wt %, greater than or equal to about 0.15 wt %, greater than or equal to about 0.2 wt %, greater than or equal to about 0.25 wt %, greater than or equal to about 0.3 wt %, greater than or equal to about 0.35 wt %, greater than or equal to about 0.4 wt %, or greater than or equal to about 0.45 wt % and less than or equal to about 5 wt %, less than or equal to about 4 wt %, less than or equal to about 3 wt %, or less than or equal to about 2 wt %, or less than or equal to about 1 wt %.

In the quantum dot polymer composite, a metal oxide particle may be further included.

Details of the quantum dots, the aromatic halide compound, and the ene compound are the same as set forth above. Details of the metal catalyst and the metal are the same as set forth above. The polymer matrix may include a repeating unit including an arylene-vinylene moiety (e.g., substituted or unsubstituted phenylene-vinylene group). In the quantum dot polymer composite, an amount of the quantum dots and the metal oxide particles may be less than or equal to about 90 wt %, less than or equal to about 80 wt %, less than or equal to about 70 wt %, less than or equal to about 60 wt %, less than or equal to about 50 wt %, less than or equal to about 40 wt %, less than or equal to about 30 wt %, or less than or equal to about 20 wt %, based on a total weight of the composite. The amount of the quantum dots and the metal oxide particles may be greater than or equal to about 10 wt %, greater than or equal to about 20 wt %, greater than or equal to about 30 wt %, greater than or equal to about 40 wt %, or greater than or equal to about 50 wt %, based on a total weight of the composite.

The quantum dot polymer composite may exhibit a residue of greater than or equal to about 70 wt % as determined by a thermogravimetric analysis.

Details of the polymer formed by the coupling reaction between the aromatic halide compound and the ene compound having at least one a C—H moiety and a carbon-carbon unsaturated bond are the same as set forth above.

In an embodiment, the polymer may include in its repeating unit, a moiety represented by the following chemical formula, a bisphenol A moiety, an alkylene oxide moiety (e.g., a propylene oxide moiety, an ethylene oxide moiety), a substituted or unsubstituted C1 to C30 alkylene moiety, a substituted or unsubstituted C3 to C40 (hetero) arylene moiety (e.g., a phenylene moiety, a naphthylene moiety, or a fluorenylene moiety), or a combination thereof:

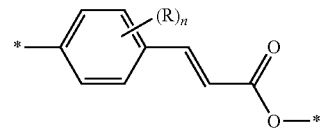

in the above formula, each R independently is a substituted or unsubstituted C1 to C30 alkyl group; a substituted or unsubstituted C2 to C30 alkyl group in which at least one methylene is replaced with a carbonyl group, an ether group, an ester group, or a combination thereof; a substituted or unsubstituted C1 to C30 alkoxyl group; a trialkyl silyl group; a substituted or unsubstituted C6 to C40 aryl group; or a substituted or unsubstituted C3 to C40 heteroaryl group, n is 0 or an integer of 1 or greater, and

* is a portion that is linked to an adjacent atom in the main chain of the polymer.

Figure 2:
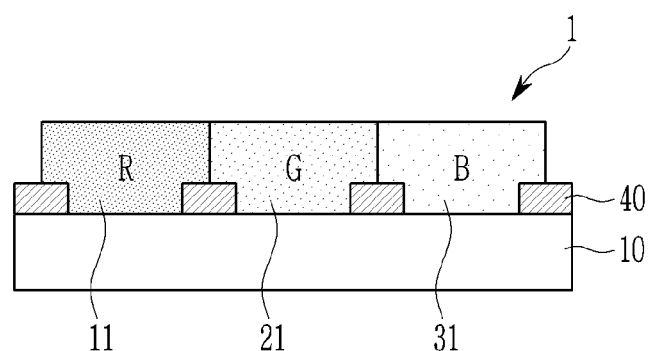
FIG. 2 is a schematic cross-sectional view showing a stack structure according to one or more non-limiting embodiments.

In another embodiment, a stack structure may include a substrate; and an emission layer (e.g., photoluminescent layer) disposed on the substrate, wherein the emission layer includes a pattern of the quantum dot-polymer composite and the pattern includes a repeating section emitting light of a predetermined wavelength. In an embodiment, the pattern of the quantum dot polymer composite may include a repeating section including a first section emitting first light, a second section emitting second light, or a combination thereof. This is illustrated in FIG. 2 and described in further detail below.

The first light and the second light have different maximum photoluminescence peak wavelengths in a photoluminescence spectrum. In an embodiment, the first light may be red light present at a maximum photoluminescence peak wavelength of about 600 nm to about 650 nm (e.g., about 620 nm to about 650 nm), and the second light may be green light present at a maximum photoluminescence peak wavelength of about 500 nm to about 550 nm (e.g., about 510 nm to about 550 nm).

The substrate may be a substrate including an insulating material (e.g., insulating transparent substrate). The substrate may include glass; various polymers such as polyesters (e.g., polyethylene terephthalate (PET), polyethylene naphthalate (PEN)), polycarbonates, polyacrylates, polyimides, and polyamideimides; polysiloxane (e.g. PDMS); inorganic materials such as $Al_2O_3$, ZnO; or a combination thereof, but is not limited thereto. Herein "transparent" refers to transmittance for light in a predetermined wavelength (e.g., light emitted from the quantum dot) of greater than or equal to about 85%, for example, greater than or equal to about 88%, greater than or equal to about 90%, greater than or equal to about 95%, greater than or equal to about 97%, or greater than or equal to about 99%. A thickness of the substrate may be desirably selected in consideration of a substrate material but is not particularly limited. The transparent substrate may have flexibility. The transparent substrate may be an upper substrate of a liquid crystal panel.

The emission layer may further include a third section to emit or transmit third light (e.g., blue light) that is different from the first light and the second light. A maximum peak wavelength of the third light may be greater than or equal to about 380 nm and less than or equal to about 480 nm.

FIG. 2 is a schematic cross-sectional view showing a stack structure 1 according to a non-limiting embodiment. The stack structure shown in FIG. 2 includes a first section 11 emitting red light (R), a second section 21 emitting green light (G), and a third section 31 emitting blue light (B), as well as black matrices 40 disposed between the sections, all of which are formed on for example, a transparent substrate 10. When the first light is red light, the second light is green light, and the light source is blue light, an optical element to block (e.g., reflect or absorbs) the blue light may be disposed on a front surface (light emitting surface) of the first section and the second section. When the light source may further include a green light, an optical element to block (e.g., reflect or absorb) the green light may be disposed on a front surface (a light emitting surface) of the third section.

The quantum dot polymer composite and the pattern thereof are the same as described above.

In a display device including the above stack structure, the light source may include a plurality of light emitting units respectively corresponding to the first section and the second section, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). A thin film transistor (TFT) and a substrate (e.g., glass substrate) may be disposed under the OLED and structures and materials of the electroluminescent device and organic light emitting diode (OLED) are known, but not particularly limited.

Figure 3:
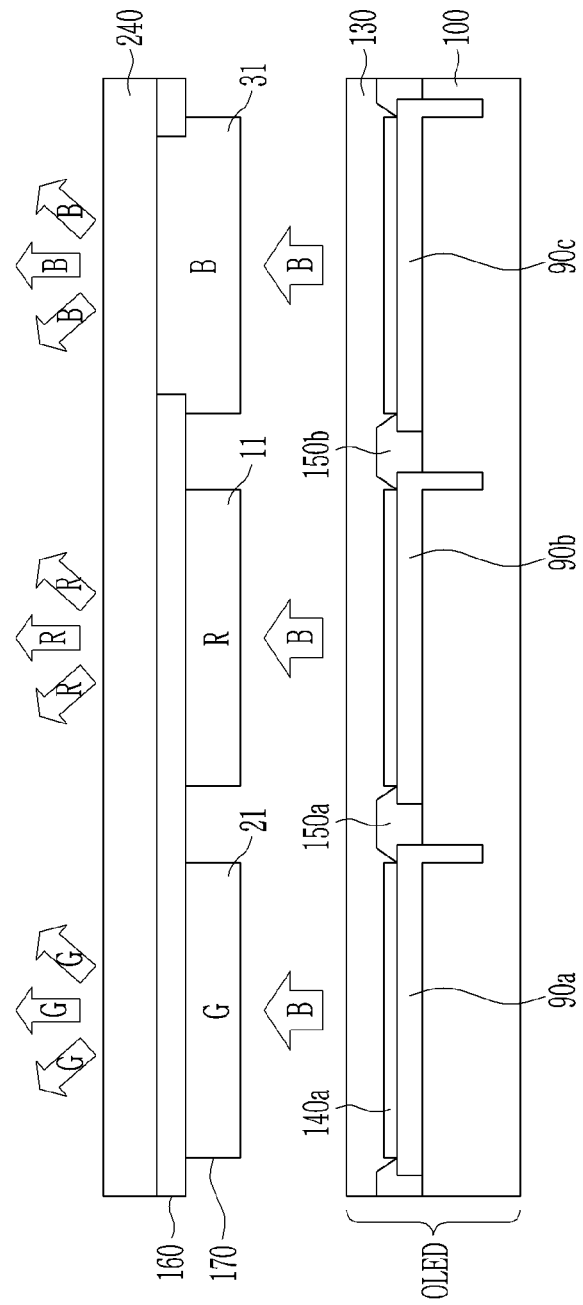
FIGS. 3 and 4 are schematic cross-sectional views showing display devices according to one or more non-limiting embodiments.
Figure 4:
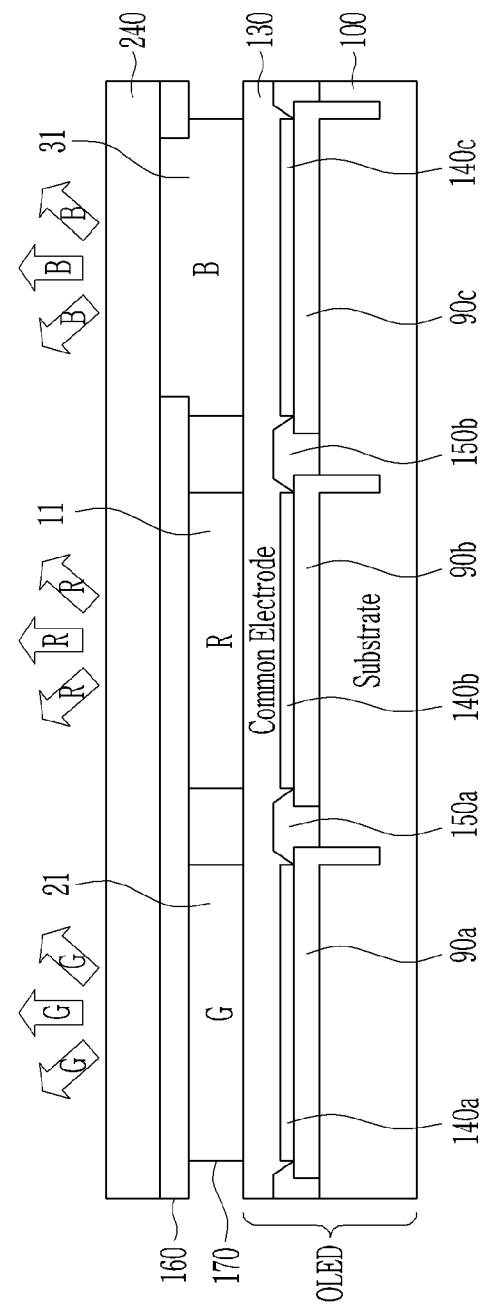

FIGS. 3 and 4 are schematic cross-sectional views showing display devices according to exemplary embodiments. Referring to FIGS. 3 and 4, a light source includes an organic light emitting diode (OLED) emitting blue light and optionally green light.

The organic light emitting diode (OLED) may include at least two pixel electrodes 90a, 90b, and 90c on a substrate 100, pixel define layers 150a and 150b formed between neighboring pixel electrodes 90a, 90b, and 90c, organic emission layers 140a, 140b, and 140c on each pixel electrode, and a common electrode 130 formed on the organic emission layers.

The substrate 100 may include an insulating material and may have flexibility. Details of the substrate are the same as described above.

A line layer including a thin film transistor or the like is formed on the substrate. The line layer may further include a gate line, a sustain voltage line, a gate insulating layer, a data line, a gate electrode, a source electrode, a drain electrode, a semiconductor layer, a protective layer, and the like. The detail structure of the line layer may be verified according to an embodiment. The gate line and the sustain voltage line are electrically separated from each other, and the data line is insulated and crosses the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrodes 90a, 90b, and 90c may function as an anode of the display device. The pixel electrode may include a transparent conductive material such as indium tin oxide (ITO) or indium zinc oxide (IZO). The pixel electrode may include a material having a light-blocking properties such as gold (Au), platinum (Pt), nickel (Ni), tungsten (W), chromium (Cr), molybdenum (Mo), iron (Fe), cobalt Co), copper (Cu), palladium (Pd), titanium (Ti), and the like. Alternatively, the pixel electrode may have a two-layered structure where the transparent conductive material and the material having light-blocking properties are stacked sequentially.

Between two adjacent pixel electrodes, a pixel defining layer (PDL) 150a and 150b overlaps with a terminal end of the pixel electrode to divide the pixel electrode into a pixel unit. The pixel define layer is an insulating layer which may electrically block the at least two pixel electrodes.

The pixel define layer covers a part of the upper surface of the pixel electrode, and the remaining region of the pixel electrode that is not covered by the pixel define layer may provide an opening. An organic emission layer 140a, 140b, and 140c which will be described later may be formed in the region defined by the opening.

The organic emission layer 140a, 140b, and 140c defines each pixel area by the pixel electrode and the pixel define layer. In other words, one pixel area may be defined as an area including one organic emission unit layer which is contacted with one pixel electrode divided by the pixel define layer.

For example, in the display device according to an embodiment, the organic emission layer may be defined as a first pixel area, a second pixel area, and a third pixel area, and each pixel area is spaced apart from each other leaving a predetermined interval by the pixel define layer.

The organic emission layer may emit a third light belonging to visible light region or belonging to UV region. That is, each of the first to the third pixel areas of the organic emission layer may emit a third light. In an embodiment, the third light may be a light having the highest energy in the visible light region, for example, blue light. When all pixel areas of the organic emission layer are designed to emit the same light, each pixel area of the organic emission layer may include the same or similar materials or may have the same or similar properties. Thus, it may significantly simplify the process of forming the organic emission layer, so that it may be applied to large scale/large area applications. However, the organic emission layer according to an embodiment is not necessarily limited thereto, but the organic emission layer may be designed to emit at least two different lights.

The organic emission layer may include an organic emission unit layer in each pixel area, and each organic emission unit layer may further include an auxiliary layer (e.g., a hole injection layer, a hole transport layer, an electron transport layer, etc.) besides the emission layer.

The common electrode 130 may function as a cathode of the display device. The common electrode may include a transparent conductive material such as indium tin oxide (ITO) or indium zinc oxide (IZO). The common electrode may be formed on the organic emission layer 140a, 140b, and 140c and may be integrated therewith.

A planarization layer or passivation layer (not shown) may be formed on the common electrode. The planarization layer may include an (e.g., transparent) insulating material for providing electrical insulation with the common electrode.

A stack structure may be disposed on the light source and the stack structure includes the pattern of the quantum dot polymer composite 170 (e.g., a first section including a red quantum dot and a second section including a green quantum dot) and a substrate 240. The blue light emitted from a light source enters the first section and the second section to emit red and green light, respectively. The blue light emitted from a light source may transmit the third section.

This display device may be manufactured by separately manufacturing the above stack structure and (e.g., blue light-emitting) OLED and then assembling them. Alternatively, the display device may be manufactured by directly forming a quantum dot polymer composite pattern on the OLED.

In the display device according to an embodiment, an optical element blocking (e.g., reflecting or absorbing) blue light (i.e., an excitation light blocking layer 160) may be disposed on the first section emitting red light and the second section emitting green light. The optical element blocking excitation light (e.g., blue light) (or an excitation light blocking layer 160 may include a blue light reflection layer, a blue light absorption layer, or a combination thereof. The excitation light blocking layer 160 may include a blue cut filter, a polymer layer including a yellow dye, or a combination thereof, and the blue light blocking layer may be disposed on a substrate. The excitation light blocking layer 160 may be disposed on the first section and the second section between the substrate and the quantum dot-polymer composite pattern. A detailed description of the excitation light blocking layer is the same as that of a first optical filter 310 which are described herein (for example, referring to FIG. 5).

In another embodiment, the display device may further include a lower substrate, a polarizer disposed under (below) the lower substrate, and a liquid crystal layer disposed between the stack structure and the lower substrate, wherein the stack structure is disposed so that the emission layer faces the liquid crystal layer. The display device may further include a polarizer between the liquid crystal layer and the emission layer. The light source may further include an LED and optionally, a light guide panel.

Figure 5:
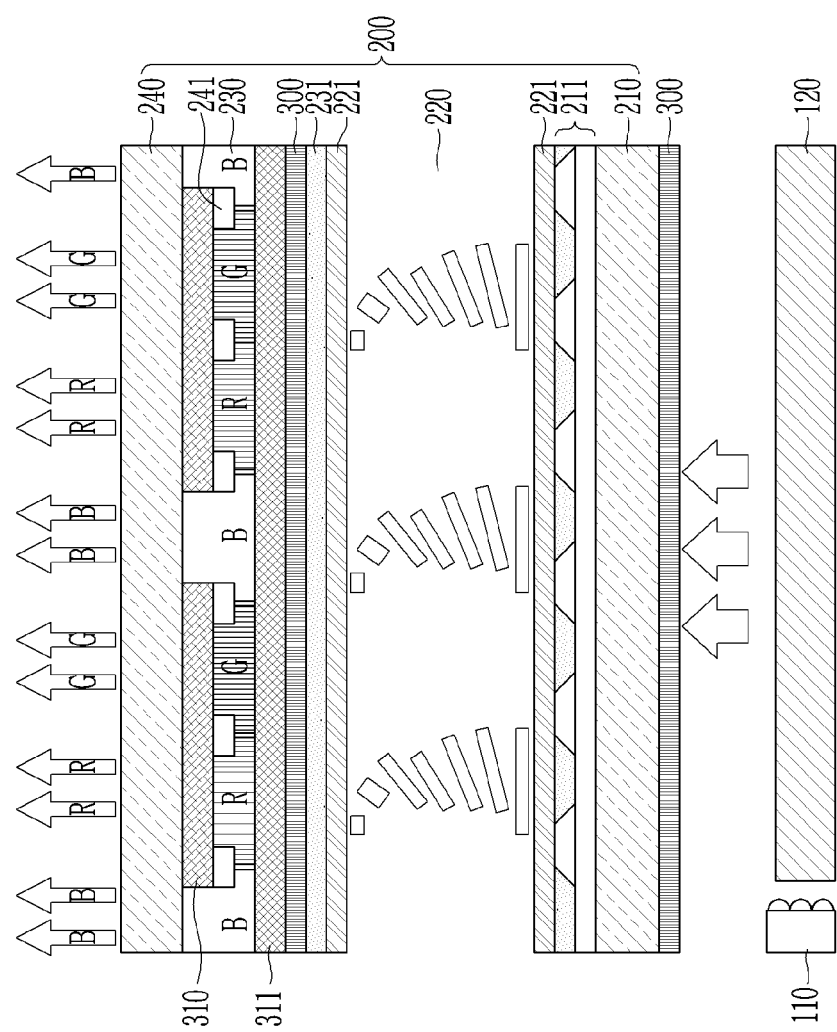
FIG. 5 is a schematic cross-sectional view showing a display device according to one or more non-limiting embodiments.

Non-limiting examples of the display device (e.g., a liquid crystal display device) according to an embodiment are illustrated with a reference to a drawing. FIG. 3 is a schematic cross-sectional view showing a liquid crystal display according to an embodiment. Referring to FIG. 5, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate (or referred to as upper substrate) 240 and a photoluminescent layer 230 including a pattern of a quantum dot polymer composite.

The lower substrate 210 (i.e., an array substrate) may be a transparent insulating material substrate. The substrate is the same as described above. A line plate 211 is provided on an upper surface of the lower substrate 210. The line plate 211 may include a plurality of gate lines (not shown) and data lines (not shown) that define a pixel area, a thin film transistor disposed adjacent to a crossing region of gate lines and data lines, and a pixel electrode for each pixel area, but is not limited thereto. Details of such line plates are known and are not particularly limited.

The liquid crystal layer 220 may be disposed on the line plate 211. The liquid crystal panel 200 may include an alignment layer 221 on and under the liquid crystal layer 220 to initially align the liquid crystal material included therein. Details (e.g., a liquid crystal material, an alignment layer material, a method of forming a liquid crystal layer, a thickness of liquid crystal layer, or the like) of the liquid crystal material and the alignment layer are known and are not particularly limited.

A lower polarizer 300 is provided under the lower substrate. Materials and structures of the polarizer 300 are known and are not particularly limited. A backlight unit (e.g., emitting blue light) may be disposed under the polarizer 300. An upper optical element or an upper polarizer 300 may be provided between the liquid crystal layer 220 and the transparent substrate 240, but is not limited thereto. For example, the upper polarizer 300 may be disposed between the liquid crystal layer the photoluminescent layer. A layer for transmitting blue light and recycling may be disposed between the upper polarizer 300 and the photoluminescent layer 230.

The polarizer may be any polarizer that used in a liquid crystal display device. The polarizer may be TAC (triacetyl cellulose) having a thickness of less than or equal to about 200 μm, but is not limited thereto. In another embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, and/or an optical sheet (not shown) on the light guide panel, for example, a diffusion plate, a prism sheet, and the like, but is not limited thereto. The backlight unit may not include a light guide panel. In an embodiment, the backlight unit may provide direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an optical sheet. Details (e.g., each component of a light emitting diode, a fluorescent lamp, light guide panel, various optical sheets, and a reflector) of such a backlight unit are known and are not particularly limited.

A black matrix 241 is provided under the transparent substrate 240 and has openings and hides a gate line, a data line, and a thin film transistor of the line plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. Optionally, the photoluminescent layer may further include a fourth section. The fourth section may include a quantum dot that emits light with different color from light emitted from the first to third sections (e.g., cyan, magenta, and yellow light).

In the photoluminescent layer 230, sections forming a pattern may be repeated corresponding to pixel areas formed on the lower substrate. A transparent common electrode 231 may be provided on the photoluminescent color filter layer (or photoluminescent layer 230).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as it is. Optionally, the third section may include a quantum dot emitting blue light.

If desired, the display device may further have an excitation light (e.g., blue light and optionally green light) blocking layer or a first optical filter layer 310. The excitation light blocking layer may be disposed between lower surfaces of the first section (R) and the second section (G) (and optionally the third section (B)) and the upper substrate 240 or on the upper surface of the upper substrate 240. The excitation light blocking layer may be a sheet having an opening in a region corresponding to a pixel area (a third section) displaying blue and thus formed in a region corresponding to the first and second sections. That is to say, the first optical filter layer may be disposed at the positions except the position overlapped with the third section and integrally therewith as shown in FIG. 5, but is not limited thereto. An excitation light (e.g., green light) cut filter may be disposed on the third section. For example, at least two first optical filter layers 310 may be disposed leaving a space at each position overlapped with the first and second sections.

The first optical filter layer may block light having, for example, a predetermined wavelength region in the visible light region and may transmit light in the other wavelength regions, and, for example, it may block blue light (or green light) and may transmit light except the blue light (or green light). For example, it may transmit green light, red light, and/or yellow light which is a mixed light thereof.

In an embodiment, the first optical filter layer may substantially block, for example, blue light at less than or equal to about 500 nm, and may have a property to transmit the remaining visible light in a wavelength region of greater than about 500 nm and less than or equal to about 700 nm.

For example, the first optical filter layer may have a light transmittance of greater than or equal to about 70%, greater than or equal to about 80%, greater than or equal to about 90%, or even about 100% for the visible light in a wavelength region of greater than or equal to 500 nm and less than or equal to about 700 nm.

The first optical filter layer may be a polymer thin film including a dye and/or a pigment that absorbs a light to be blocked, and may absorb a blue light, for example, having a wavelength of about less than or equal to about 480 nm, as much as greater than or equal to about 80%, greater than or equal to about 90%, or even greater than or equal to about 95%, but may have a light transmittance of greater than or equal to about 70%, greater than or equal to about 80%, greater than or equal to about 90%, and even about 100% to the visible light having a wavelength of greater than about 500 nm and less than or equal to about 700 nm.

The first optical filter layer may substantially block (e.g., absorb) blue light having a wavelength of less than or equal to about 500 nm by absorbing the same, and it may selectively transmit, for example, green light, or red light. In this case, at least two first optical filter layers may be disposed with spacing apart at each position which is overlapped with each of the first to second sections. For example, the first optical filter layer selectively transmitting red light may be disposed in a position which is overlapped with the red light emitting section, and the first optical filter layer selectively transmitting green light may be disposed on a position which is overlapped with the green light emitting section. For example, the first optical filter layer may include a first region to block (e.g., absorb) blue light and red light and to selectively transmit light in a predetermined range (e.g., greater than or equal to about 500 nm, greater than or equal to about 510 nm, or greater than or equal to about 515 nm, and less than or equal to about 550 nm, for example, less than or equal to about 545 nm, less than or equal to about 540 nm, less than or equal to about 535 nm, less than or equal to about 530 nm, less than or equal to about 525 nm, or less than or equal to about 520 nm), and a second region to block (e.g., absorb) blue light and green light and to selectively transmit light in a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a position overlapped with the green light emitting section and the second region may be disposed at a position overlapped with the red light emitting section. The first region and the second region may optically be isolated. Such a first optical filter layer may contribute to improvement of color purity of the display device.

The first optical filter layer may be a reflective filter including a plurality of layers (e.g., inorganic material layer) having different refractive indexes and for example, it may be formed by alternatively stacking two layers having different refractive indexes, for example, by alternatively stacking a layer having a high refractive index and a layer having a low refractive index. As a refractive index difference between the layer having a high refractive index and the layer having a low refractive index is higher, the provided first optical filter layer has the higher selectivity to a wavelength. A thickness and the stacked number of the layers having a high refractive index and the layers having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

The total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material, or may be different from each other, and all layers having a low refractive index may have the same thickness and the same material, or may be different from each other.

The display device may further include a second optical filter layer (e.g., a red/green or yellow light recycle layer) 311 disposed between the light emission layer and the liquid crystal layer (e.g., the light emission layer and the upper polarizer), transmitting at least a part of third light, and reflecting at least a part of the first light and/or second light. The second optical filter layer 311 may reflect light in a wavelength region of greater than about 500 nm. The first light may be red light, the second light may be green light, and the third light may be blue light.

In the display device according to an embodiment, the second optical filter layer may be formed as an integrated layer having a relatively planar surface.

In an embodiment, the second optical filter layer may include a monolayer having a low refractive index, for example, it may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, it may be formed by alternatively stacking two layers having different refractive indexes, or for example, it may be formed by alternatively stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, but according to embodiments, it may include a variety of materials having a higher refractive index than the layer having a low refractive index.

The layer having a low refractive index in the second optical filter layer may include, for example, a silicon oxide, but according to embodiments, it may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. The total thickness of the second optical filter layer may be, for example, about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials, or different thickness and materials from each other.

The second optical filter layer may reflect at least a part of the first light (R) and the second light (G) and may transmit at least a part (e.g., whole part) of the third light (B). For example, the second optical filter layer may transmit only the third light (B) in a blue light wavelength region having a wavelength of less than or equal to about 500 nm, and the light in a wavelength region of greater than about 500 nm, which is green light (G), yellow light, red light (R), or the like, may not be passed through the second optical filter layer and reflected. The reflected green light and red light may pass through the first and second sections and to be emitted to the outside of the display device.

The second optical filter layer may reflect light in a wavelength region of greater than about 500 nm in greater than or equal to about 70%, greater than or equal to about 80%, or greater than or equal to about 90%, or even about 100%.

Meanwhile, the second optical filter layer may have a transmittance to light in a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

Hereinafter, the embodiments are illustrated in more detail with reference to examples. However, they are exemplary examples of the present disclosure, and the present disclosure is not limited thereto.

EXAMPLES

Analytic Methods

[1] Viscosity of the Composition

Viscosity of the composition is measured at 23.1° C. at a shear rate of 0.1/s to 10/s by increasing at a rate of 0.5/s, by using a Discovery Hybrid Rheometer made by TA Instruments. Herein, the viscosity is measured by using a cone plate as a geometry with a gap of 0.052 mm.

[2] Surface Tension of the Composition

A contact angle of the composition is measured by using a contact angle measurement apparatus (Model No. DSA100S) made by Kruss, and surface tension is calculated through the Owens-Wendt formula. Herein, deionized (DI) water and diiodomethane solution, which are readily measured and provide precise measurement values, are used for analysis. Surface tension was calculated based on equation 1:

$$\gamma_{SL} = \gamma_S + \gamma_{LV} - 2(\gamma_S^d \gamma_{LV}^d)^{1/2} - 2(\gamma_S^p \gamma_{LV}^p)^{1/2} \qquad \text{Equation 1}$$

[3] Vapor Pressure of Composition

A vapor pressure (in millimeters of mercury, mm Hg) of a composition is measured at a predetermined temperature by using MINIVAP VPXpert made by Grabner Instruments.

[4] a Thermogravimetric Analysis

A TGA of a composite is measured at a predetermined temperature by using a thermogravimetry equipment made from Perkin Elmer Co., Ltd.

[5] UV-Vis Spectroscopy Analysis

An AGILENT Cary 5000 spectrometer is used to perform a UV-Vis spectroscopy analysis and obtain an UV-Visible absorption spectrum.

[6] Photoluminescence Analysis

A HITACHI F-7000 spectrometer is used to obtain a photoluminescence (PL) spectrum of a produced quantum dot at a wavelength of 450 nm.

Reference Example 1: Preparation of Red Light Emitting Non-Cadmium Quantum Dot (1) 0.2 millimoles (mmol) of indium acetate, 0.6 mmol of palmitic acid, and 10 milliliters (mL) of 1-octadecene are put in a reactor and heated to 120° C. under vacuum. After one hour, an atmosphere in the reactor is converted into nitrogen. The reactor is heated up to 280° C., and a mixed solution of 0.1 mmol of tris(trimethylsilyl)phosphine ($TMS_3P$) and 0.5 mL of trioctylphosphine is rapidly injected thereto, and the obtained mixture is reacted for 20 minutes. The reactor is rapidly cooled down to room temperature, acetone is added to the cooled reaction solution, a precipitate is obtained by centrifuging the obtained mixture, and the obtained precipitate is dispersed in toluene to obtain a toluene dispersion of InP semiconductor nanocrystal. Sulfur was dispersed in trioctyl phosphine (TOP) to obtain S/TOP stock solution.

0.3 mmol (0.056 g) of zinc acetate, 0.6 mmol (0.189 g) of oleic acid, and 10 mL of trioctylamine are put in a reaction flask and vacuum-treated at 120° C. for 10 minutes. The inside of the reaction flask is substituted with $N_2$, and then the reaction flask is heated up to 220° C. A toluene dispersion (OD: 0.15) of the InP semiconductor nanocrystal and a small amount of S/TOP are put into the reaction flask, and then, heated up to 280° C. and reacted for 30 minutes. When the reaction is complete, the reaction solution is rapidly cooled down to room temperature to obtain a reaction product including InP/ZnS semiconductor nanocrystals.

(2) An excess of ethanol is added to the reaction product including the InP/ZnS semiconductor nanocrystal, and then, the mixture is centrifuged. After the centrifuging, a supernatant is removed therefrom, and a precipitate therein is dried to obtain a quantum dot powder. According to the UV-Vis Spectroscopy analysis and Photoluminescenceanalysis of the quantum dot, the quantum dot emits red light.

Examples 1 to 16

[1] Quantum dot powder prepared in Reference Example 1 and titanium oxide particles are mixed with the aromatic halide compounds, the ene compounds, and the palladium catalysts as shown in Tables 1 and 2 with stirring for 30 minutes to produce an ink composition.

In the ink composition, amounts of the quantum dots, the metal oxide particles, the first and second aromatic halide compounds and the first and second ene compounds, and the palladium catalyst are summarized in Table 3.

For the ink compositions, a vapor pressure at 20° C., a surface tension at 23° C., a viscosity of the composition were measured and the results are summarized in Table 4 and Table 5.

[2] The ink composition of each of Examples 15 and 16 is discharged through an ink jet system on a glass substrate at room temperature without causing a nozzle clogging to form a film. The film pattern thus obtained is heated at 130° C. for 2 minutes to react the components to form a desired pattern of a quantum dot polymer composite.

TABLE 1

|  | Aromatic halide compound | Ene compound | Palladium catalyst |
| --- | --- | --- | --- |
| Example1 | 3-bromoanisole | 2-ethylhexyl acrylate | $PdCl_2[P(o-Tol)_3]_2$ |
| Example3 | 1-bromo-4-(trimethylsilyl)benzene | 2-ethylhexyl acrylate | $PdCl_2[P(o-Tol)_3]_2$ |
| Example4 | 1-bromo-4-tertbutyl benzene | 2-ethylhexyl acrylate | $PdCl_2[P(o-Tol)_3]_2$ |
| Example5 | 4-bromopropylbenzene | 2-ethylhexyl acrylate | $PdCl_2[P(o-Tol)_3]_2$ |
| Example6 | 4-bromododecylbenzene | 2-ethylhexyl acrylate | $PdCl_2[P(o-Tol)_3]_2$ |
| Example7 | ethyl-2-bromobenzoate | 2-ethylhexyl acrylate | $PdCl_2[P(o-Tol)_3]_2$ |
| Example8 | methyl 3-bromo-4-methylbenzoate | 2-ethylhexyl acrylate | $PdCl_2[P(o-Tol)_3]_2$ |
| Example10 | 2,5 dibromo-p-xylene | isooctylacrylate | $PdCl_2[P(o-Tol)_3]_2$ |
| Example11 | 2,5 dibromo-p-xylene | ehtylhexylacrylate | $PdCl_2[P(o-Tol)_3]_2$ |

TABLE 2

|  | First aromatic halide compound | Second aromatic halide compound | Second ene compound | First ene compound | Palladium catalyst |
| --- | --- | --- | --- | --- | --- |
| Example15 | 2,5 dibromo-p-xylene | 4-bromo-octylbenzene | 2-ethylhexyl acrylate | Neopentyl glycol propoxylate diacrylate | $PdCl_2[P(o-Tol)_3]_2$ |
| Example16 | 2,5 dibromo-p-xylene | 4-bromo-octylbenzene | 2-ethylhexyl acrylate | Tripropylene glycol diacrylate | $PdCl_2[P(o-Tol)_3]_2$ |

TABLE 3

| Amounts (wt %) | QD | TiO2 | First aromatic halide compound | Second aromatic halide compound | Second ene compound | First ene compound | Palladium catalyst |
|---|---|---|---|---|---|---|---|
| Ex 1 to 11 | 27 | 4 | | 40 | 28.5 | | 0.5 |
| Example 15 | 27 | 4 | 3.5 | 36.5 | 9.5 | 19 | 0.5 |
| Example 16 | 27 | 4 | 3.5 | 36.5 | 9.5 | 19 | 0.5 |

TABLE 4

| Properties | Example 1 | Example 3 | Example 4 | Example 5 | Example 6 | Example 7 | Example 8 |
|---|---|---|---|---|---|---|---|
| Boiling point (° C.) | 210 | 230 | 231 | 225 | 313.7 | 255 | 457 |
| Vapor pressure at 20° C. (mm Hg) | 0.13 | 0.03 | 9.3E−01 | 0.03 | 9.9E−04 | 0.19 | 8.9E−05 |
| Surface tension at 23° C. (mN/m) | 34.6 | 39.4 | 33.8 | 33.3 | 33.7 | 40.7 | 39.3 |
| QD dispersibility | ok | ok | ok | ok | ok | ok | ok |

TABLE 5

| Properties | Example10 | Example11 | Example 15 | Example 16 |
|---|---|---|---|---|
| Boiling point (° C.) | 196.8 | 213 | 296 | 284 |
| Vapor pressure at 20° C. (mm Hg) | 6.8E−03 | 4.4E−05 | 9.9E−04 | 0.01 |
| Surface tension at 23° C. (mN/m) | 38.9 | 31.3 | 33.5 | 31.7 |
| QD dispersibility | ok | ok | | |
| Viscosity (cP) | 2 | 1.7 | 7.2 | 7.35 |

The results of Tables confirm that the compositions of Examples satisfy the properties required by the ink jet system.

Experimental Example 1

Figure 6:
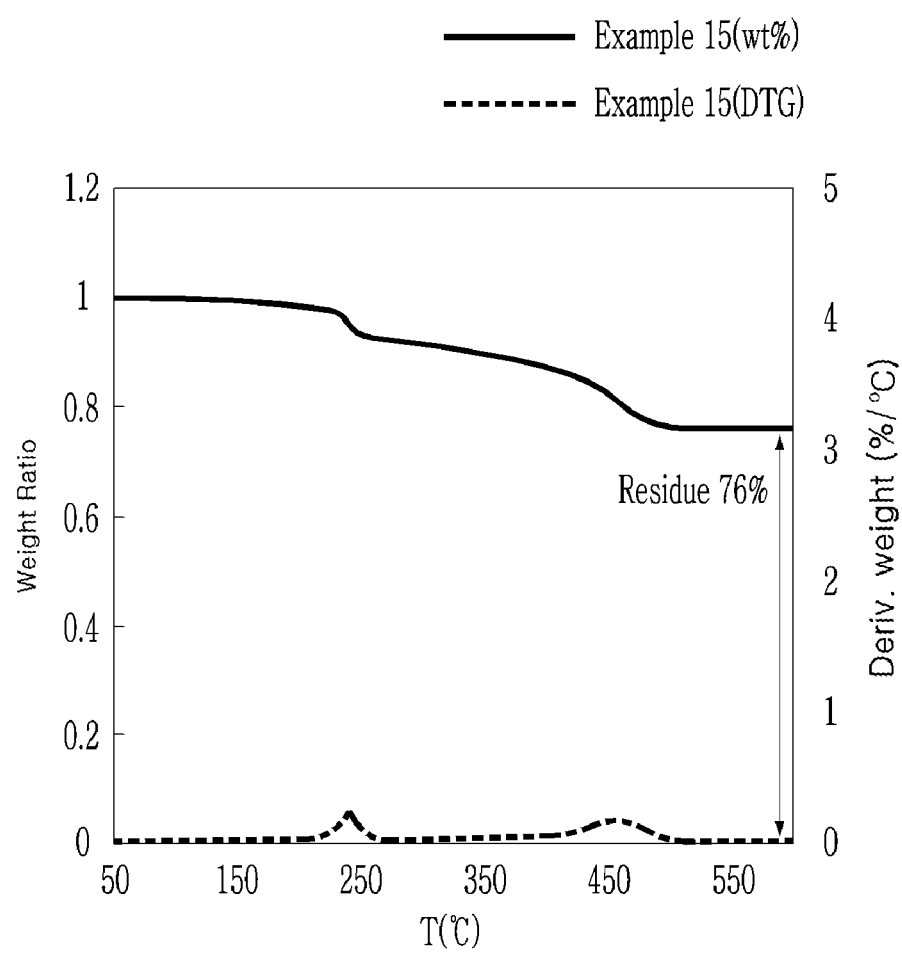
FIG. 6 is a graph of a weight ratio versus temperature (° C.) and shows the results of a thermogravimetric analysis for the quantum dot-polymer composite prepared in Example 15. DTG is the first derivative of the TGA curve.
Figure 7:
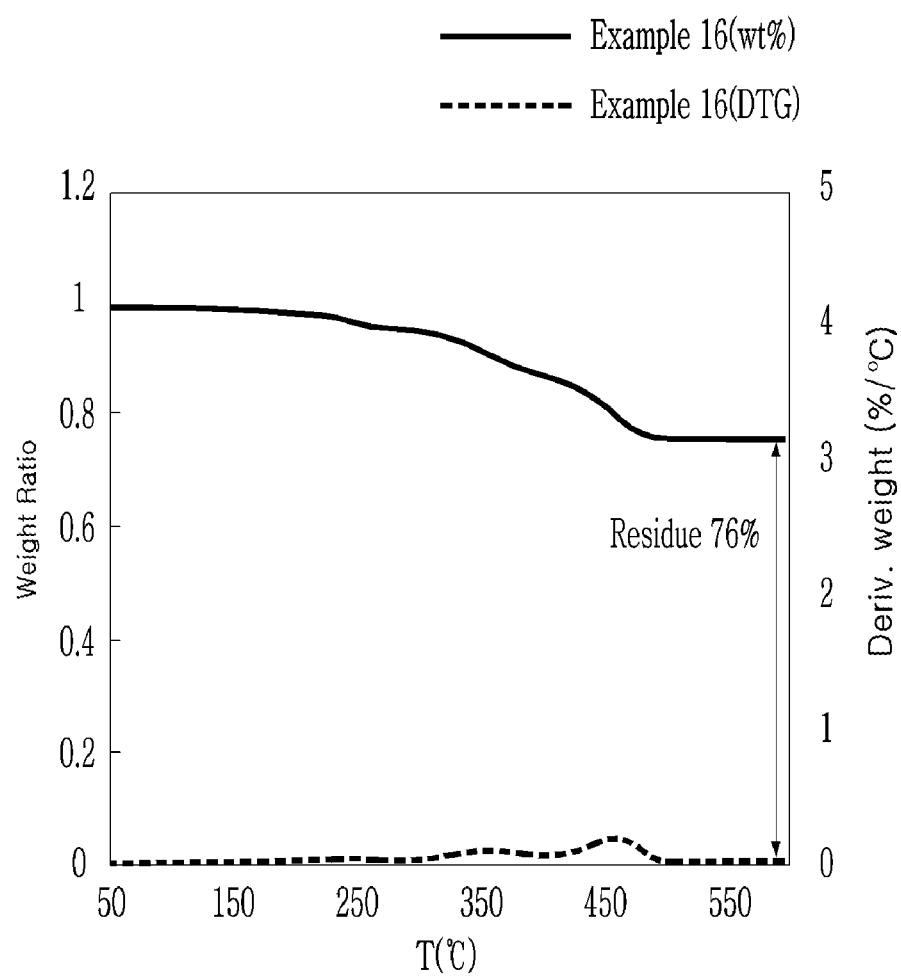
FIG. 7 is a graph of a weight ratio versus temperature (° C.) and shows the results of a thermogravimetric analysis for the quantum dot-polymer composite prepared in Example 16. DTG is the first derivative of the TGA curve.

For the quantum dot polymer composite of Example 15 and Example 16, a TGA analysis is carried out and the results are shown in FIG. 6 and FIG. 7. The results confirm that the quantum dot polymer composite exhibits extremely high thermal stability.

While this disclosure has been described in connection with what is presently considered to be practical example embodiments, it is to be understood that the disclosure is not limited to the disclosed exemplary embodiments, but, on the contrary, is intended to cover various modifications and equivalent arrangements included within the spirit and scope of the appended claims.

What is claimed is:

1. An ink composition, comprising:
a quantum dot;
a metal catalyst;
an aromatic halide compound;
an ene compound comprising at least one C—H moiety and a carbon-carbon unsaturated bond; and
optionally, a metal oxide particle,
wherein the metal catalyst comprises a metal salt, a metal coordination complex, or a combination thereof, and
wherein the metal catalyst comprises a metal that is palladium, nickel, ruthenium, rhodium, iridium, iron, cobalt, chromium, copper, platinum, silver, gold, or a combination thereof.

2. The ink composition of claim 1, wherein in the ink composition, an amount of the metal is less than or equal to about 0.2 moles based on one mole of the ene compound.

3. The ink composition of claim 1, wherein the ink composition has a viscosity of less than or equal to about 20 centipoise, or a vapor pressure of less than or equal to about 1.5 mmHg.

4. The ink composition of claim 1, wherein the ink composition has a boiling point of greater than or equal to about 190° C.

5. The ink composition of claim 1, wherein the ink composition exhibits an average particle size of less than or equal to about 2 micrometer as determined by a dynamic light scattering analysis (DLSA).

6. The ink composition of claim 1, wherein the quantum dot is a Group II-VI compound, a Group III-V compound, a Group IV-VI compound, a Group IV element or compound, a Group I-III-VI compound, a Group II-III-VI compound, a Group I-II-IV-VI compound, or a combination thereof.

7. The ink composition of claim 1, wherein the quantum dot comprises:
a core comprising a first semiconductor nanocrystal, wherein the first semiconductor nanocrystal comprises indium, zinc, or a combination thereof; and
a shell disposed on the core and comprising a second semiconductor nanocrystal having a different composition from the first semiconductor nanocrystal.

8. The ink composition of claim 1, wherein the quantum dot comprises an organic ligand and the organic ligand comprises RCOOH, RNH$_2$, R$_2$NH, R$_3$N, RSH, R$_3$PO, R$_3$P, ROH, RCOOR, RPO(OH)$_2$, RHPOOH, RHPOOH, or a combination thereof,
wherein each R is independently a substituted or unsubstituted C1 to C40 aliphatic hydrocarbon group, or a substituted or unsubstituted C6 to C20 aromatic hydrocarbon group.

9. The ink composition of claim 1, wherein the metal catalyst comprises Pd(OAc)$_2$, Pd(PPh$_3$)$_4$, PdCl$_2$, PdCl$_2$[P(o-Tol)$_3$]$_2$, Ni(acac)$_2$, NiCl$_2$(dppe), NiCl$_2$(dppp), NiCl$_2$(PCy$_3$)$_2$, NiCl$_2$(dbpf), NiCl$_2$(PCy$_2$Ph)$_2$, NiCl$_2$(Ipr)(PPh$_3$), Ni(cod)$_2$, RuCl$_2$(PPh$_3$)$_3$, CpRuCl(PPh$_3$)$_2$, RuH$_2$(CO)(PPh$_3$)$_3$, Ru(acac)$_3$, [(C$_6$H$_6$)RuCl$_2$]$_2$, [(hmb)RuCl$_2$]$_2$, [(p-cymene)RuCl$_2$]$_2$, RuH(PPh$_3$)$_4$, RhCl(PPh$_3$)$_3$, RhCl(CO)

(PPh₃)₂, Rh₂(OAc)₄, Rh(nbd)₂(BF₄), [RhCl(nbd)]₂, [RhCl(cod)]₂, [RhCl(coe)₂]₂, [RhCl(ethylene)₂]₂, [Cp*RhCl₂]₂, [Rh2(esp)]₂, [Ir(cod)(Pcy₃)(py)]PF₆, [Cp*IrCl₂]₂, [IrCl(cod)]₂, [Ir(OMe)(cod)]₂, IrCl(CO)(PPh₃)₂, IrH(CO)(PPh₃)₂, Ir(acac)(cod), [IrCl(coe)₂]₂, Fe(OAc)₂, Fe(acac)₃, Fe(hfacac)₃, [CpFe(CO)₂]₂, Fe(dppd)₃, FeCl₃, CoCl₂, CrCl₂, CuI, CuO, Cu(OAc)₂, Cu(acac)₂, Cu(tfa)₂, Cu(hfacac)₂, Cu(acac)(cod), (Imes)CuCl, (Ipr)CuCl, (Ipr)Cu(dppd), Cu(OH)(tmeda)Cl₂, Pt(PPh₃)₄, Pt(P(t-Bu)₃)₂, PtCl₂(cod), Pt(acac)₂, (Ipr)AgCl, (Ipr)AuCl, (PPh₃)AuCl, or a combination thereof, wherein OAc is acetate, OMe is methoxy, Cy is cyclopentyl, dppd is N,N'-diphenyl-1,4-phenylenediamine, dppe is bis(diphenylphosphino)ethane, dbpf is 1,1'-Bis(diphenylphosphino)ferrocene, dppp is 1,3-Bis(diphenylphosphino)-propane], esp is α,α,α',α'-tetramethyl-1,3-benzenedipropionic acid, hmb is η⁶-C₆(CH₃)₆, tmeda is bis(N,N,N',N'-tetramethylethylenediamine), acac is acetylacetonate, hfacac is hexafluoroacetylacetonate, Cp is η⁵-cyclopentadienyl, Cp* is η⁵-C₅(CH₃)₅, coe is cis-cyclooctene, cod is 1,5-cyclooctadiene, nbd is bis[η-(2,5-norbomadiene), tfa is trifluoroacetate, Ph is phenyl, o-Tol is ortho-toluoyl, Imes is 1,3-Bis(2,4,6-trimethylphenyl)imidazol-2-ylidene, Ipr is 1,3-bis(2,6-diisopropylphenyl)imidazole-2-ylidene, t-Bu is tertiary butyl, and py is pyridyl.

10. The ink composition of claim 1, wherein the metal catalyst comprises a palladium salt, a palladium complex, or a combination thereof.

11. The ink composition of claim 1, wherein the metal catalyst comprises tetrakis(triarylphosphine)palladium(0), a palladium halide, a palladium organic ester compound, a palladium inorganic ester compound, or a combination thereof.

12. The ink composition of claim 1, wherein the metal catalyst further comprises a base compound, a supporting ligand, or a combination thereof, and
wherein the base compound comprises a tertiary amine, an alkali metal carbonate, an alkaline earth metal carbonate, an alkali metal carboxylate, an alkaline earth metal carboxylate, or a combination thereof; or
wherein the supporting ligand comprises an organic phosphine compound, an organic amine compound, a phosphinooxazoline, a phosphinooxazoline ester, acetylacetonate, or a combination thereof.

13. The ink composition of claim 1, wherein the aromatic halide compound comprises a first aromatic halide having a first center aromatic moiety and at least two halogen groups linked to the first center aromatic moiety and optionally a second aromatic halide having a second center aromatic moiety, a single halogen group linked to the second center aromatic moiety, and a hydrophobic moiety.

14. The ink composition of claim 13, wherein the first aromatic halide comprises a compound represented by Chemical Formula 1, or
the second aromatic halide comprises a compound represented by Chemical Formula 2:

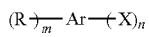

Chemical Formula 1 wherein in Chemical Formula 1, each R is independently a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, n is an integer of 2 or greater, Ar is a substituted or unsubstituted C6 to C40 arene, a substituted or unsubstituted C3 to C40 heteroarene, a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen containing moiety with each other, and each X is independently F, Cl, Br, or I; and

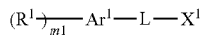

Chemical Formula 2 wherein in Chemical Formula 2, each R¹ independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, Ar¹ is a substituted or unsubstituted C6 to C40 arene or a substituted or unsubstituted C3 to C40 hetero arene, a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen containing moiety with each other, L is a direct bond, or a carbon-carbon triple bond, X¹ is F, Cl, Br, or I, m1 is 0 or an integer of 1 or greater.

15. The ink composition of claim 1, wherein the ene compound comprises:
a first ene compound comprising at least two carbon-carbon unsaturated bonds; and
optionally a second ene compound comprising a single carbon-carbon unsaturated bond,
wherein first ene compound, the second ene compound, or a combination thereof optionally comprises a hydrophobic moiety.

16. The ink composition of claim 15, wherein the first ene compound comprises a compound represented by Chemical Formula 3 and the second ene compound comprises a compound represented by Chemical Formula 4-1 or Chemical Formula 4-2:

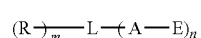

Chemical Formula 3 wherein in Chemical Formula 3, each R independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group, m is 0 or an integer of 1 or greater, L is a carbon atom, a substituted or unsubstituted C1 to C50 alkylene group, sulfonyl (—SO$_2$—), carbonyl (CO), ether (—O—), sulfide (—S—), sulfoxide (—SO—), ester (—C(=O)O—), amide (—C(=O)NR'—) wherein R' is hydrogen or a C1 to C10 alkyl, a bisphenyl A moiety, a substituted or unsubstituted C6 to C40 arylene, a substituted or unsubstituted C3 to C40 heteroarylene, a substituted or unsubstituted C9 to C40 polycyclic aromatic hydrocarbon, a substituted or unsubstituted C9 to C40 polycyclic heteroaromatic hydrocarbon, or a combination thereof, each A independently is a direct bond, a substituted or unsubstituted C1 to C50 alkylene group, sulfonyl (—SO$_2$—), carbonyl (CO), ether (—O—), sulfide (—S—), sulfoxide (—SO—), ester (—C(=O)O—), amide (—C(=O)NR"—) wherein R" is hydrogen or a substituted or unsubstituted C1 to C10 alkyl, or a combination thereof, each E is the same or different each other, and is a (meth)acrylate, —CR=CHR$^a$, or —C≡CH, wherein R or R$^a$ is each independently hydrogen or a substituted or unsubstituted C1 to C10 alkyl group, n is an integer of 2 or greater;

$$CHR=CRR \quad \text{Chemical Formula 4-1}$$

$$CH\equiv CR \quad \text{Chemical Formula 4-2}$$

wherein in Chemical Formulae 4-1 and 4-2, each R is the same or different and is hydrogen, C(O)OR$^1$, —O—C(O)—R$^1$, a substituted or unsubstituted C1 to C30 alkyl group, or a substituted or unsubstituted C6 to C20 aryl group, wherein each R$^1$ independently is a substituted or unsubstituted C1 to C30 alkyl group.

17. The ink composition of claim 15, wherein the first ene compound comprises an ethylene glycol oligomer comprising at least two (meth)acrylate groups, a propylene glycol oligomer comprising at least two (meth)acrylate groups, a bisphenol A glycerolate di(meth)acrylate, a neopentylglycol di(meth)acrylate, or a combination thereof; or
the second ene compound comprises a (meth)acrylate comprising a C3 to C30 alkyl group, a vinyl compound comprising a C3 to C30 alkyl group, or a combination thereof.

18. The ink composition of claim 1, wherein the ink composition comprises a single compound represented by Chemical Formula 5 as the ene compound and the aromatic halide compound:

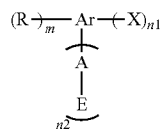

Chemical Formula 5 wherein in Chemical Formula 5, each R independently is a substituted or unsubstituted C1 to C30 alkyl group; a substituted or unsubstituted C2 to C30 alkyl group in which at least one methylene is replaced with carbonyl, ether, ester, or a combination thereof; a substituted or unsubstituted C1 to C30 alkoxy group; a trialkylsilyl group; a substituted or unsubstituted C6 to C40 aryl group; or a substituted or unsubstituted C3 to C40 heteroaryl group;

m is 0 or an integer of 1 or greater,

Ar is a substituted or unsubstituted C6 to C40 arene, a substituted or unsubstituted C3 to C40 heteroarene, a substituted or unsubstituted C9 to C40 polycyclic aromatic hydrocarbon, a substituted or unsubstituted C9 to C40 polycyclic heteroaromatic hydrocarbon, or a group having two or three arenes linked through nitrogen or a nitrogen containing moiety with each other, each X independently is F, Cl, Br, or I, each A independently is a direct bond, a substituted or unsubstituted C1 to C50 alkylene group, sulfonyl (—SO$_2$—), carbonyl (CO), ether (—O—), sulfide (—S—), sulfoxide (—SO—), ester (—C(=O)O—), amide (—C(=O)NR'—) wherein R' is hydrogen or a substituted or unsubstituted C1 to C10 alkyl, or a combination thereof, each E is the same or different each other, and is a (meth)acrylate, —CR=CHR$^a$, or —C≡CH wherein R or R$^a$ is each independently hydrogen or a substituted or unsubstituted C1 to C10 alkyl group, n1 is an integer of 1 or greater; and n2 is an integer of 1 or greater.

19. The ink composition of claim 1, wherein the metal oxide particle has an average particle size of greater than or equal to about 100 nm and less than or equal to about 500 nm, and the metal oxide particle comprises titanium oxide, silicon oxide, barium oxide, zinc oxide, hafnium oxide, zirconium oxide, aluminum oxide, gallium oxide, indium oxide, germanium oxide, tin oxide, antimony oxide, scandium oxide, yttrium oxide, lanthanum oxide, ruthenium oxide, cerium oxide, tantalum oxide, niobium oxide, or a combination thereof.

20. The ink composition of claim 1, wherein the ink composition comprises:
based on a total weight of the composition,
about 1 wt % to about 60 wt % of the quantum dot;
about 0.01 wt % to about 5 wt % of the metal catalyst;
about 1 wt % to about 70 wt % of the aromatic halide compound;
about 1 wt % to about 70 wt % of the ene compound; and
optionally, about 1 wt % to about 20 wt % of the metal oxide particle.

21. A quantum dot polymer composite, comprising:
a polymer matrix;
a plurality of quantum dots dispersed in the polymer matrix;
a metal catalyst; and
optionally, a metal oxide particle dispersed in the polymer matrix,
wherein the polymer matrix comprises a polymer formed by a coupling reaction between an aromatic halide compound and an ene compound, wherein the ene compound comprises at least one C—H moiety and a carbon-carbon unsaturated bond,
wherein the metal catalyst comprises a metal salt, a metal coordination complex, or a combination thereof; and
wherein the metal catalyst comprises a metal that is palladium, nickel, ruthenium, rhodium, iridium, iron, cobalt, chromium, copper, platinum, silver, gold, or a combination thereof.

22. The quantum dot polymer composite of claim 21, wherein in the quantum dot polymer composite, an amount of the metal catalyst is greater than 0 and less than or equal to about 10 wt %, based on a total weight of the composite.

23. The quantum dot polymer composite of claim 21, wherein on a thermogravimetric analysis, a residue amount of the quantum dot polymer composite is greater than or equal to about 70 wt % based on a total weight of the quantum dot-polymer composite.

24. A display device, comprising: a light source and a light emitting element, wherein the light emitting element comprises the quantum dot-polymer composite of claim 21, and wherein the light source provides the light emitting element with incident light.

25. The display device of claim 24, wherein the light emitting element comprises a stacked structure comprising a substrate and a light emitting layer disposed on the substrate, wherein the light emitting layer comprises a pattern comprising the quantum dot-polymer composite, and
  wherein the pattern comprising the quantum dot-polymer composite comprises at least one repeating section configured to emit light at a predetermined wavelength.

26. A method of producing a pattern comprising a quantum dot-polymer composite, the method comprising:
  depositing the ink composition of claim 1 on a substrate to form a patterned film of the ink composition; and
  reacting the aromatic halide compound and the ene compound in the presence of the metal catalyst.

\* \* \* \* \*